(12) United States Patent
Walters et al.

(10) Patent No.: US 9,764,954 B2
(45) Date of Patent: Sep. 19, 2017

(54) PARTICULATE MATERIALS, COMPOSITES COMPRISING THEM, PREPARATION AND USES THEREOF

(75) Inventors: Ian Walters, Ammanford (GB); Martin Williams, Ammanford (GB)

(73) Assignee: HAYDALE GRAPHENE INDUSTRIES PLC, Ammanford, Camarthenshire (GB)

( * ) Notice: Subject to any disclaimer, the term of this patent is extended or adjusted under 35 U.S.C. 154(b) by 324 days.

(21) Appl. No.: 13/992,201

(22) PCT Filed: Dec. 8, 2011

(86) PCT No.: PCT/GB2011/001707
§ 371 (c)(1),
(2), (4) Date: Aug. 16, 2013

(87) PCT Pub. No.: WO2012/076853
PCT Pub. Date: Jun. 14, 2012

(65) Prior Publication Data
US 2013/0320274 A1    Dec. 5, 2013

(30) Foreign Application Priority Data

Dec. 8, 2010 (GB) .................................. 1020836.1
Oct. 3, 2011 (GB) .................................. 1117129.5

(51) Int. Cl.
*B01J 2/12* (2006.01)
*C01B 31/02* (2006.01)
(Continued)

(52) U.S. Cl.
CPC ......... *C01B 31/0253* (2013.01); *B01J 19/088* (2013.01); *B82Y 30/00* (2013.01);
(Continued)

(58) Field of Classification Search
CPC ......... B01J 19/088; B82Y 30/00; A61K 48/00
(Continued)

(56) References Cited

U.S. PATENT DOCUMENTS 5,234,723 A    8/1993  Babacz
5,414,324 A    5/1995  Roth et al.
(Continued)

FOREIGN PATENT DOCUMENTS

CN    1598045 A     3/2005
CN    2780327    *  5/2006  ............. B02C 23/00
(Continued)

OTHER PUBLICATIONS

A. Reina et al., "Large Area, Few Layer Graphene Films on Arbitrary Substrates by Chemical Vapor Deposition", 2009, Nano letters 9(1), pp. 30-35.
(Continued)

*Primary Examiner* — Khanh Tuan Nguyen
(74) *Attorney, Agent, or Firm* — Arent Fox LLP

(57) ABSTRACT

Methods of processing particulate carbon material, such as graphic particles or agglomerates of carbon nanoparticles such as CNTs are provided. The starting material is agitated in a treatment vessel in the presence of low-pressure (glow) plasma generated between electrodes. The material is agitated in the presence of conductive contact bodies such as metal balls, on the surface of which plasma glow is present and amongst which the material to be treated moves. The methods effectively deagglomerate nanoparticles, and exfoliate graphitic material to produce very thin graphitic sheets showing graphene-type characteristics. The resulting nanomaterials used by dispersal in composite materials, e.g. conductive polymeric composites for electric or electronic
(Continued)

articles and devices. The particle surfaces can be functionalized by choosing appropriate gas in which to form the plasma.

16 Claims, 14 Drawing Sheets

(51) Int. Cl.
    *B01J 19/08*     (2006.01)
    *B82Y 30/00*     (2011.01)
    *C09C 1/44*     (2006.01)
    *H05H 1/24*     (2006.01)
    *C01B 31/04*     (2006.01)
    *B82Y 40/00*     (2011.01)

(52) U.S. Cl.
    CPC .......... *B82Y 40/00* (2013.01); *C01B 31/0273* (2013.01); *C01B 31/0423* (2013.01); *C09C 1/44* (2013.01); *H05H 1/2406* (2013.01); *B01J 2219/083* (2013.01); *B01J 2219/0809* (2013.01); *B01J 2219/0818* (2013.01); *B01J 2219/0841* (2013.01); *B01J 2219/0847* (2013.01); *B01J 2219/0869* (2013.01); *B01J 2219/0886* (2013.01); *C01P 2002/84* (2013.01); *C01P 2004/03* (2013.01); *C01P 2004/62* (2013.01); *C01P 2004/64* (2013.01); *C01P 2006/60* (2013.01); *H05H 2001/2431* (2013.01); *Y10T 428/2982* (2015.01)

(58) Field of Classification Search
    USPC ........................... 106/472; 427/212; 428/403
    See application file for complete search history.

(56) References Cited

U.S. PATENT DOCUMENTS

| | | | |
|---|---|---|---|
| 6,147,452 | A | 11/2000 | Kunhardt et al. |
| 6,156,114 | A | 12/2000 | Bell et al. |
| 6,383,301 | B1 | 5/2002 | Bell et al. |
| 6,428,861 | B2 | 8/2002 | France et al. |
| 6,955,800 | B2 | 10/2005 | Resasco et al. |
| 7,243,610 | B2 | 7/2007 | Ishii et al. |
| 7,305,934 | B2 | 12/2007 | Ishii |
| 7,442,358 | B2 | 10/2008 | Sano et al. |
| 7,498,013 | B2 | 3/2009 | Fischer et al. |
| 7,575,733 | B2 | 8/2009 | Fischer et al. |
| 7,658,901 | B2 | 2/2010 | Prud'homme et al. |
| 7,824,741 | B2 | 11/2010 | Sandhu |
| 8,048,214 | B2 | 11/2011 | Prud'homme et al. |
| 8,066,964 | B2 | 11/2011 | Prud'homme et al. |
| 8,167,190 | B1 | 5/2012 | Bullock et al. |
| 8,278,757 | B2 | 10/2012 | Crain et al. |
| 8,697,485 | B2 | 4/2014 | Crain et al. |
| 2002/0054995 | A1 | 5/2002 | Mazurkiewicz |
| 2008/0206124 | A1 | 8/2008 | Jang et al. |
| 2008/0261116 | A1 | 10/2008 | Burton et al. |
| 2009/0023851 | A1 | 1/2009 | Bierdel et al. |
| 2009/0090640 | A1 | 4/2009 | Jang et al. |
| 2009/0124805 | A1 | 5/2009 | Alleyne |
| 2009/0214705 | A1 | 8/2009 | Ledon et al. |
| 2010/0081057 | A1 | 4/2010 | Liu et al. |
| 2010/0127312 | A1 | 5/2010 | Grebel et al. |
| 2010/0176337 | A1 | 7/2010 | Zhamu et al. |
| 2010/0180820 | A1 | 7/2010 | Ishimaru et al. |
| 2010/0301279 | A1 | 12/2010 | Nesper et al. |
| 2010/0317790 | A1 | 12/2010 | Jang et al. |
| 2011/0012067 | A1 | 1/2011 | Kay |
| 2012/0097923 | A1 | 4/2012 | Liang et al. |
| 2012/0097928 | A1 | 4/2012 | Kim et al. |
| 2012/0104432 | A1 | 5/2012 | Shim et al. |
| 2012/0105046 | A1 | 5/2012 | Marshall et al. |
| 2012/0107562 | A1 | 5/2012 | Bolotin et al. |
| 2013/0102084 | A1 | 4/2013 | Loh et al. |
| 2014/0014495 | A1 | 1/2014 | Dickinson et al. |

FOREIGN PATENT DOCUMENTS

| | | | |
|---|---|---|---|
| CN | 101717083 A | 6/2010 | |
| CN | 101800302 A | 8/2010 | |
| CN | 101867046 A | 10/2010 | |
| DE | 196 12 270 C1 | 9/1997 | |
| EP | 1 484 435 B1 | 12/2004 | |
| JP | S57177342 A | 11/1982 | |
| JP | 6 000365 A | 1/1994 | |
| JP | H06365 A | 1/1994 | |
| JP | 2003-300716 A | 10/2003 | |
| JP | 2004-261747 A | 9/2004 | |
| JP | 2004-323593 A | 11/2004 | |
| JP | 2005-135736 A | 5/2005 | |
| JP | 2009-022895 * | 2/2009 | ............. B01J 19/08 |
| JP | 2009-22895 A | 2/2009 | |
| WO | WO 98/12368 A1 | 3/1998 | |
| WO | WO 2004/099490 A1 | 11/2004 | |
| WO | WO 2006/014626 A2 | 2/2006 | |
| WO | WO 2006/040398 A1 | 4/2006 | |
| WO | WO 2006/050903 A2 | 5/2006 | |
| WO | WO 2006/051153 A2 | 5/2006 | |
| WO | WO 2007/021769 A2 | 2/2007 | |
| WO | WO 2007/021770 A2 | 2/2007 | |
| WO | WO 2007/026167 A1 | 3/2007 | |
| WO | WO 2007/047084 A2 | 4/2007 | |
| WO | WO 2007/136389 A2 | 11/2007 | |
| WO | WO 2008/019927 A1 | 2/2008 | |
| WO | WO 2008/060703 A2 | 5/2008 | |
| WO | WO 2009/000408 A1 | 12/2008 | |
| WO | WO 2009/085015 A1 | 7/2009 | |
| WO | WO 2009/099707 A1 | 8/2009 | |
| WO | WO 2009/106507 A2 | 9/2009 | |
| WO | WO 2009/123771 A2 | 10/2009 | |
| WO | WO 2009/153051 A1 | 12/2009 | |
| WO | WO 2009/156275 A1 | 12/2009 | |
| WO | WO 2009/158117 A2 | 12/2009 | |
| WO | WO 2010/052478 A1 | 5/2010 | |
| WO | WO 2010/097517 A2 | 9/2010 | |
| WO | WO 2010/115173 A1 | 10/2010 | |
| WO | WO 2010/142953 A1 | 12/2010 | |
| WO | WO 2012/053711 A1 | 4/2012 | |
| WO | WO 2012/056632 A1 | 5/2012 | |
| WO | WO 2012/057516 A2 | 5/2012 | |
| WO | WO 2013/026827 A1 | 2/2013 | |

OTHER PUBLICATIONS

A. Vollmer et al., "Electronic and Structural Properties of Graphene-based Transparent and Conductive Thin Film Electrodes", 2009, Applied Physics A 94, pp. 1-4.
Arkema, "Engineered Multi-Wall Carbon Nanotubes", Feb. 2007.
B. Guo et al., "Graphene Doping: A Review", 2011, Insciences J. 1 (2), pp. 80-89.
B. Khare et al., "Low-Temperature Plasma Functionalization of Carbon Nanotubes", 2004, NASA Tech Briefs, p. 22.
Bayer, "Baytubes® C 150 P" Datasheet, Feb. 24, 2009.
Bayer, "Concrete Reinforcement", [publication date unknown]—printed May 5, 2009.
Bayer, "Dispersion", 2007-2008.
Bayer, "Dye-Printing of Polyester Yarns", 2007-2008.
C. Chen et al., "Amino group introduction onto multiwall carbon nanotubes by NH3/Ar plasma treatment", Apr. 1, 2010, Carbon 48(4), pp. 939-948.
Chinese Office Action, dated May 21, 2014, issued in Chinese Patent Application No. 201080035273.X.
D. Jiang et al., "Porous Graphene as the Ultimate Membrane for Gas Separation", 2009, Nano letters 9(12), pp. 4019-4024.
D.R. Paul et al., "Polymer nanotechnology: Nanocomposites", 2008, Polymer 49, pp. 3187-3204.
F. Chen et al., "Electrochemical Gate-Controlled Charge Transport in Graphene in Ionic Liquid and Aqueous Solution", 2009, J. Am. Chem. Soc. 131(29), pp. 9908-9909.

(56) References Cited

OTHER PUBLICATIONS

H.Z. Geng et al., "Effect of Acid Treatment on Carbon Nanotube-Based Flexible Transparent Conducting Films", 2007, J. Am.Chem. Soc. 129, pp. 7758-7759.

I. H. Loh et al., "Modification of carbon surfaces in cold plasmas", 1987, J. Mater. Sci. 22, pp. 2937-2947.

I.H. Chen, et al., "Preparation of Carbon Nanotube (CNT) Composites by Polymer Functionalized CNT under Plasma Treatment", 2010, Plasma Process. Polym. 7, pp. 59-63.

International Search Report and Written Opinion, dated Mar. 15, 2012, issued in International Patent Application No. PCT/GB2011/001707.

International Search Report and Written Opinion, dated Sep. 28, 2010, issued in International Patent Application No. PCT/GB2010/001132.

J. A. Kim, et al., "Effects of surface modification on rheological and mechanical properties of CNT/epoxy composites" Aug. 1, 2006, Carbon, Elsevier 44(10), pp. 1898-1905.

L.G. Vintizenko et al., "Hollow-cathode low-pressure arc discharges and their application in plasma generators and charged-particle sources", 2001, Russian Physics Journal 44 (9), pp. 927-936.

M. Kalbac et al., "The Influence of Strong Electron and Hole Doping on the Raman Intensity of Chemical Vapor-Deposition Graphene", 2010, ACS Nano 4(10), pp. 6055-6063.

M. M. Fogler et al., "Effect of external conditions on the structure of scrolled graphene edges", 2010, Phys. Rev. B 81, 161408(R).

M. Spasenovic, "Vorbeck patents printed electronics", 2012 http://www.graphenetracker.com/vorbeck-patents-printed-electronics/.

M. V. Naseh, et al., "Functionalization of Carbon Nanotubes Using Nitric Acid Oxidation and DBD Plasma", Jan. 2009, PWASET 37, pp. 177-179.

Nanowerk News, "Controlling the formation of graphene nanoscrolls", accessed at http://www.nanowerk.com/news/newsid=15914.php, Apr. 21, 2010.

P. Špatenka et al., "Industrial-Scale Process Control by Means of Electrostatic Probes", 2000, Plasmas and Polymers 5(¾), pp. 255-263.

Phagocytosis of Long, Straight and Short, Tangled Multi-walled Carbon Nanotubes, May 2008, accessed at http://cohesion.rice.edu/CentersAndInst/ICON/emplibrary/ACF230.pdf.

U. Vohrer et al., "Plasma Modification of Carbon Nanotubes and Bucky Papers", 2007, Plasma Process. Polym. 4, pp. S871-S877.

V. Bruser et al., "Surface modification of carbon nanofibres in low temperature plasmas", 2004, Diamond and Related Materials 13(4-8); pp. 1177-1181.

Bruser V. et al., "Surface modification of carbon nanofibres in low temperature plasmas," Diamond and Related Materials, Apr. 1, 2004, pp. 1177-1181, vol. 13, No. 4-8, Elsevier Science Publishers, Amsterdam, NL.

International Search Report, PCT/GB2011/001707, dated Mar. 15, 2012.

Kim, J. A, et al, "Effects of surface modification on rheological and mechanical properties of CNT/epoxy composites," Carbon, Elsevier, Aug. 1, 2006, pp. 1898-1905, vol. 44, No. 10, Oxford, GB.

Japanese Office Action mailed Sep. 25, 2015 for corresponding Japanese Application No. 2013-542602, with complete English Translation.

Extended European Search Report mailed Feb. 10, 2016 for corresponding European Patent Application No. 15191861.2.

* cited by examiner

PARTICULATE MATERIALS, COMPOSITES COMPRISING THEM, PREPARATION AND USES THEREOF

CROSS-REFERENCE TO RELATED APPLICATIONS

This application is a National Stage entry of International Application No. PCT/GB2011/001707, filed Dec. 8, 2011, which claims priority to United Kingdom Patent Application No. 1020836.1, filed Dec. 8, 2010 and United Kingdom Patent Application No. 1117129.5, filed Oct. 3, 2011. The disclosures of the prior applications are hereby incorporated in their entirety by reference.

This invention has to do with particulate materials, treatment and preparation of particulate materials, composite materials comprising such particulate materials, articles and devices comprising such composites, methods for their preparation and uses thereof.

The proposals herein have particular application for the processing of inorganic or mineral particulate material in which some or all of the particles comprise, consist of (or consist essentially of) agglomerated, tangled or mutually cohering subsidiary or component particles or structures such as nanoparticles or atomic layers.

In particular, preferred embodiments relate to carbon or carbon-containing materials, in which the mentioned component particles or structures may be special allotropes of carbon such as fullerenes (notably tubular fullerenes, i.e. nanotubes), or graphene comprised in graphitic or stacked-graphene bodies. The special proposals herein contribute to disaggregating or separating the component particles or structures, such as disentangling and separating CNTs or exfoliating graphene, preferably with subsequent dispersion thereof in a liquid vehicle or matrix material.

BACKGROUND

CNTs

Carbon nanotubes (CNTs), their remarkable properties and potential properties, and methods of making them have been known for many years. However their industrial uses are still very limited, largely because of processing and handling issues. They can be made by various processes but the main ones are arc discharge from carbon-containing electrodes, and vapour-phase deposition of carbon, by laser ablation or CVD, onto metal catalyst particles. These methods can make CNTs of single-wall and multi-wall types (SWCNTs and MWCNTs) and are well-known to the skilled person.

The resulting CNTs are usually contaminated with residues of one or more of catalyst, amorphous carbon and (usually undesired) closed fullerenes and these residues tend to bind the CNTs together. Moreover CNTs, like most nanoparticles, have a strong tendency to agglomerate under the influence of van der Waals' forces, because of their extremely high specific surface area. With CNTs this is exacerbated by their very high aspect ratio leading to extensive tangling and winding, and structures such as lumps, granules, tangled bundles or "ropes" of twisted CNTs. Most high volume production batches of CNTs made by the above mentioned methods consist essentially of such tangled and contaminated aggregate structures.

Many of the important uses envisaged to exploit the special properties of CNTs involve dispersing them in matrix or binder materials. As an intermediate handling stage, dispersal in a liquid vehicle such as water or organic solvent is envisaged (especially in view of the health risk presented by the dry particles). However the routine existence of the bulk product in the form of tangled agglomerates and their lack of relative chemical affinity for the vehicle or matrix presents a formidable obstacle to dispersion. Where dispersions can be formed these tend to be dispersions of agglomerates, so that the properties of the CNTs themselves are scarcely made available.

It is known to functionalise and disperse nanoparticle aggregates in general, and CNTs in particular, using an aggressive combination of mechanical and chemical treatments, e.g. by boiling in acid to decompose contaminants and functionalise the carbon surface, and breaking apart the aggregates using high-shear methods such as milling, grinding or ultrasonication. The dispersion can then be stabilised to some extent in a liquid vehicle by means of surfactants or other colloid chemistry methods. This has met with some success, but these techniques for functionalising the particles remain highly inefficient, inconvenient and expensive as far as industrial application is concerned. Moreover they still achieve only modest levels of de-aggregation of the individual CNTs. Typically the CNTs are still twisted into ropes, and often have quite severe structural damage to the carbon layers (graphene layers of the CNT wall) as well as shortening of the tubes, with consequent loss of valuable CNT properties. Each chemically modified (functionalised) site represents a structural defect, with a missing carbon atom or bond re-arrangement.

CNTs also present a real or perceived health hazard if inhaled or in general if they contact permeable body membranes. Accordingly, despite widespread knowledge of their potential properties and of ways of making them, they have found limited industrial application.

Graphene

Separately, graphene is known as the single-layer hexagonal form of carbon, corresponding to a single layer of the graphite structure but with properties exceeding graphite's because of the absence of neighbouring layers. Graphene layers can be made to quite large sizes by careful mechanical "exfoliation" or intercalation utilising an oxidant such as concentrated sulphuric acid and nitric acid, from graphite, by reduction of exfoliated graphene oxide, or by epitaxial growth on substrates of other materials. However the known methods are laborious and expensive.

Use of graphite-based materials, with their characteristic layer structure (a graphene sheet being a hexagonal lattice of carbon atoms, and graphite being a stacked series of these sheets) becomes relatively attractive in view of the drawbacks of CNTs. Even when extremely thin (one or a few layers) they are more particle-like than CNTs and, as a consequence, safer and less difficult to handle and disperse. Even more than with CNTs, however, there has been no easy commercial-scale supply of readily-useable graphene material. While CNTs have been known for many years, the first successful preparations of true graphene have occurred only recently. Synthetic laboratory-grown graphene is available only in tiny quantities at enormous cost. A number of important practical applications exist but their implementation is necessarily very limited.

The other methods available to produce graphene material are as follows. Mined graphite is used as starting material. A step of intercalating to enable exfoliation may bee chemical intercalating, electrochemical intercalating, gas phase intercalating, liquid phase intercalating, supercritical fluid intercalating, or a combination thereof. Chemical intercalating may expose the graphite to sulphuric acid, sulphonic acid, nitric acid, a carboxylic acid, a metal chloride solution, a metal-halogen compound, halogen liquid or vapor, potassium permanganate, alkali nitrate, alkali perchlorate, an oxidizing agent, or a combination thereof. Halogens may also be used to intercalate, e.g. from bromine, iodine, iodine chloride, iodine bromide, bromine chloride, iodine pentafluoride, bromine trifluoride, chlorine trifluoride, phosphorus trichloride, tetrachloride, tribromide, triiodide, or combination thereof.

Electrochemical intercalating may use nitric acid or a carboxylic acid as both electrolyte and intercalate source, with a current density in the range of 50 to 600 A/m$^2$ at the graphite, which is used as an electrode.

The step of exfoliating the intercalated graphite may comprise exposing the intercalated structure to a temperature in the range of 150° C. to 1,100° C. When the intercalating uses an acid as intercalate, the exfoliating typically comprises exposing the intercalated graphite to a temperature in the range of 600° C. to 1,100° C. When intercalating uses a halogen or halogen compound the exfoliating typically comprises exposing the intercalated graphite to a temperature in the range of 50° C. to 350° C.

THE INVENTION

The aim herein is to provide new and useful particulate materials, composite materials comprising such particulate materials, articles and devices comprising such composites, methods for their preparation and uses thereof.

Aspects of the invention include the following.

A first aspect is a particle treatment method for disaggregating, deagglomerating, exfoliating, cleaning or functionalising particles, in which the particles for treatment are subject to plasma treatment in a treatment chamber containing or comprising multiple electrically-conductive solid contact bodies or contact formations, the particles being agitated with said contact bodies or contact formations and in contact with plasma in the treatment chamber.

The particles to be treated are preferably carbon particles, such as particles which consist of or comprise graphite, carbon nanotubes (CNTs) or other nanoparticles.

Preferably said contact bodies are moveable in the treatment chamber. The treatment chamber may be a drum, preferably a rotatable drum, in which a plurality of the contact bodies are tumbled or agitated with the particles to be treated. The wall of the treatment vessel can be conductive and form a counter-electrode to an electrode that extends into an interior space of the treatment chamber.

During the treatment, desirably glow plasma forms on the surfaces of the contact bodies or contact formations.

Suitable contact bodies are metal balls or metal-coated balls. The contact bodies or contact formations may be shaped to have a diameter, and the diameter is desirably at least 1 mm and not more than 60 mm.

The pressure in the treatment vessel is usually less than 500 Pa. Desirably during the treatment, gas is fed to the treatment chamber and gas is removed from the treatment chamber through a filter. That is to say, it is fed through to maintain chemical composition if necessary and/or to avoid build up of any contamination.

The treated material, that is, the particles or disaggregated, deagglomerated or exfoliated components thereof resulting from the treatment, may be chemically functionalised by components of the plasma-forming gas, forming e.g. carboxy, carbonyl, OH, amine, amide or halogen functionalities on their surfaces. Plasma-forming gas in the treatment chamber may be or comprise e.g. any of oxygen, water, hydrogen peroxide, alcohol, nitrogen, ammonia, amino-bearing organic compound, halogen such as fluorine, halohydrocarbon such as $CF_4$ and noble gas.

In important aspects the particles being treated consist of or comprise graphitic carbon, such as mined graphite, which is exfoliated by the treatment. After the treatment the treated material may comprise or consist of discrete graphitic or graphene platelets having a platelet thickness less than 100 nm and a major dimension perpendicular to the thickness which is at least 10 times the thickness.

The treatment may be continued for at least 30 minutes and/or until the treated carbon material comprises by weight at least 90% of platelets less than 100 nm thick and in which the major dimension is at least 10 times the thickness, preferably at least 100 times the thickness. More preferably the treatment is continued until the treated carbon material comprise by weight at least 80%, preferably at least 90%, of platelets less than 30 nm thick, preferably less than 20 nm thick, and in which the major dimension is at least 10 times the thickness, preferably at least 100 times the thickness.

A further aspect herein is a method of preparing a particle dispersion or a composite material, comprising (a) treating particles by a any particle treatment method defined or described herein, and (b) dispersing the treated material in a liquid vehicle or matrix material.

The particles may be dispersed in a said matrix material which is polymeric, for example epoxy resin, polyolefin, polyurethane, polyester, polyamide or poly(meth)acrylic material or mixture or copolymer of such polymer types, or is a precursor, e.g. oligomer or monomer, of such polymer.

Especially in this aspect the treated material may comprise carbon nanotubes, or graphitic or graphene platelets as defined in any aspect or preferred aspect herein, dispersed in a said polymeric matrix material, preferably at less than 10% by weight of the composite material, to make an electrically-conductive composite material.

A further aspect herein is novel particulate carbon material as described in any aspect, such as material obtained or obtainable by any method defined or described herein, comprising discrete graphitic platelets and/or carbon nanotubes.

A further aspect is a particle dispersion or a composite material comprising any particulate carbon material defined or described herein dispersed in a liquid vehicle or matrix material. As mentioned above this may be in a matrix material which is polymeric, for example an epoxy resin, polyolefin, polyurethane, polyester, polyamide or poly (meth)acrylic material or mixture or copolymer of such polymer types, or is a precursor, e.g. oligomer or monomer, of such polymer.

A further aspect is an article or device comprising an electrically-conductive element or layer comprising or consisting of a composite material as defined above, or obtained by a method as defined or described herein, such as a photovoltaic device, field emission device, hydrogen storage device, battery or battery electrode.

Specifically in relation to graphitic material, we have found that by use of plasma processing methods described herein, a starting graphitic material can be separated effectively and at good yields into platelets containing not more than a few layers, and sometimes a single graphene layer. It is essentially a dry method at moderate temperatures. The product materials, thereby available in significant quantities at reasonable cost, are found to provide many or most of the highly desirable characteristics associated with true synthetic graphene. We have also found that the nanomaterials produced can indeed, especially because of the controllable and relatively uniform degrees of functionalisation thereof, be dispersed in matrix materials, especially polymer materials, providing excellent properties which may be deployed for example in photovoltaic devices, field emission devices, hydrogen fuel storage, rechargeable battery electrodes and (mechanically) reinforced composite materials.

We find that the plasma-processed particles of our invention are notable for the general uniformity and controllability of the degree of functionalisation of the particle surfaces in the process. They also exhibit effective functionalisation during the treatment of surfaces of the starting particles that are initially non-exposed, and offer excellent performance in this area.

As mentioned, this application proposes novel particulate carbon materials, novel composite materials containing particulate materials, products and devices containing, comprising or made from such composite materials and methods of making and using all of these.

In a further aspect the invention provides a particulate carbon material comprising or consisting of discrete graphitic or graphene platelets having a platelet thickness less than 100 nm and a major dimension (length or width) perpendicular to the thickness.

The platelet thickness is preferably less than 70 nm, preferably less than 50 nm, preferably less than 30 nm, preferably less than 20 nm, preferably less than 10 nm, preferably less than 5 nm. The major dimension is preferably at least 10 times, more preferably at least 100 times, more preferably at least 1,000 times, more preferably at least 10,000 times the thickness.

The length may be at least 2 times, at least 3 times, at least 5 times or at least 10 times the width, e.g. depending on the starting material from which the platelets are made.

The particulate material may comprise particles other than such platelets, e.g. nanotubes or nanorods mixed with them. Desirably the mass or population of the particulate carbon material comprises—by weight—at least 10%, more preferably at least 20%, more preferably at least 30%, more preferably at least 40%, more preferably at least 50%, more preferably at least 60%, more preferably at least 70%, more preferably at least 80% and perhaps at least 90%, all or substantially all of platelets having any combination of the general and preferred dimensions and dimension relationships specified above, provided that said percentage is assessed only on particles wherein the major dimension is at least 10 times, more preferably only on particles wherein the major dimension is at least 50 times or at least 100 times, the thickness. Additionally or alternatively it may be assessed only on particles whose major dimension is at least 500 nm. That is to say, occasional very large or vary small particles can be disregarded.

In particular we prefer that at least 90%, all or substantially all of the platelets are less than 100 nm thick, more preferably less than 70 nm thick.

The percentages may alternatively be determined on the basis of the numbers of particles rather than the weight, if a counting method is used for measurement. Laser diffractometry is well known as a means of measuring particle sizes and size profiles, and may be used, allowing or adjusting for the flat form of the platelets. Counting and measuring may however be done on sample sets of particles on electron microscope images, e.g. on at least 20, 50 or at least 100 measured particles.

The present invention can make the particles by processing of a coarser carbon starting material, such as particulate and/or fibrous graphite or carbon, to break it down by exfoliation and/or intercalation as distinct from growing the platelets synthetically. Thus, the material comprises particles with varied thicknesses and major dimensions, indicative of its being obtained or obtainable by such a process. Desirably it includes at least some single-layer graphene sheets for which the major perpendicular dimension is at least 10 times, more preferably at least 100 times the thickness.

Graphitic/graphene sheets may be flat, curved or rolled.

The particles may carry functional groups on the surfaces and/or edges of the platelets. These may be e.g. oxygen-containing functional groups such as carboxy, carbonyl or hydroxy, nitrogen-containing groups such as amine or amide, or halogen such as F. Desirably however the material contains at least 80%, more preferably at least 85%, more preferably at least 90% carbon.

Another aspect of the present invention is a process of making a particulate carbon material according to any of the general or preferred definitions set out above, by treating a fibrous or particulate carbon starting material, especially a graphite starting material (which might be natural graphite) in a plasma according to any method described below, thereby separating layers of the graphite structure by intercalation of plasma species and/or by exfoliation in the plasma environment.

The gas in which the plasma is formed can be selected to cause corresponding functionalisation of the platelet surfaces, e.g. as described above. Relevant components of the plasma-forming gas for this purpose may be e.g. oxygen, water, hydrogen peroxide, alcohols, nitrogen, ammonia, amino-bearing organic compounds such as ethylene diamines, halogens, or halohydrocarbons such as $CF_4$. Noble gas such as Ar can be used to prevent or limit the degree of functionalisation, e.g. by diluting an active gas and/or by being used in a separate stage so that during that stage exfoliation proceeds without functionalisation.

A particular virtue of the present plasma-based processes, especially those using mobile contact bodies as described below, is that not only do they enable remarkably easy production of highly-exfoliated graphitic sheets, with few layers and graphene-like behaviour, but they also lead to uniform and controllable functionalisation compared with, say, the prior art technique in which some of the exfoliation is mechanically driven by milling or grinding after the chemical treatment with acid that functionalises only the surfaces exposed at that time.

If wished the processed material may be subject to size or form classification to select particles of particularly desired form, e.g. the thinnest. This classification may be by e.g. a settling method.

A further aspect of the present proposals is a composite material or nanocomposite comprising any particulate carbon material as defined above dispersed as a discontinuous or substantially discontinuous phase in a continuous matrix material, desirably a solid matrix material. Also, a method of making such a composite comprising dispersing the particulate carbon material in the matrix or fluid precursor liquid thereof, optionally with previous preparation of the particulate carbon material by a method as described herein.

The matrix is preferably polymeric, thermosetting or thermoplastic. It may be for example epoxy resin, polyolefin (e.g. polyethylene or polypropylene), polyurethane, polyester, polyamide, poly(meth)acrylic or other polymer. It may be petroleum-based polymer or natural/biopolymer.

Plasma-functionalised nanoscale carbon particulates with high aspect ratios have a high specific surface area, providing superior reinforcing properties when compared with traditional fillers. In addition to the effects of the nanoreinforcements themselves, an interphase region of decreased mobility surrounding each plasma-functionalised nanofiller results in a percolating interphase network in the composite, which may play an important role in improving the properties.

Plasma-functionalised nanoscale carbon particulates can improve mechanical and barrier properties of polymers. When incorporated into polymer matrices, they can provide active or smart properties to packaging systems, potentially improving food safety/stability or information about the safety/stability status of a product.

These polymer nanocomposites usually have much better polymer-filler interactions than traditional composites. A uniform dispersion of plasma-functionalised nanoscale carbon particulates into a polymer matrix results in a very large matrix/filler interfacial area. This restricts the mechanical mobility of the matrix, improving its mechanical and thermal profile by elevating its Tg and barrier properties.

Electrically-conductive plasma-induced nanoplatelet composites are particularly useful for shielding of sensitive electronic equipment against electromagnetic interference (EMI) or radio frequency interference (RFI), and for electrostatic charge dissipation.

The amount of plasma-functionalised carbon particulates blended with the matrix polymer naturally depends on practicality, compatibility and on the effect sought. However the very fine structure of the nanoplatelets generally provides a large effect for a small amount added. The amount is usually less than 20% by weight of the composite, preferably less than 10%, less than 5% or even less than 1%.

Recently there has been a growing interest for the development of polymer/graphene nanocomposites because of their dramatically improved properties compared to the conventionally-filled polymers with a very low fraction of filler addition. Unique properties can be obtained by the addition of very small quantities of graphene flakes or nanoplatelets. The properties can therefore be enhanced in the desired respect without sacrificing the polymer's usual characteristics in other respects such as processability, mechanical properties and standard density.

The invention also provides a nanocomposite material enhancing filler comprising the above-mentioned platelets with a high length-to-width ratio. Such a nanocomposite can become electrically conductive with a small weight fraction of platelets. Conductive composites are particularly useful for shielding of sensitive electronic equipment against electromagnetic interference (EMI) or radio frequency interference (RFI), and for electrostatic charge dissipation. Another use is in photovoltaic devices, e.g. of the dye-sensitized type.

Usually dispersion of such materials is problematic because of agglomeration, but the high levels of initial dispersion (non-agglomeration) of the present materials combined with the possibility of effective and uniform chemical functionalisation, which can be selected to give compatibility with the matrix, enable good dispersion in a matrix without undue difficulty.

Examples of functionalisation are as follows.

Carbon tetrafluoride ($CF_4$) treatment followed by ammonia ($NH_3$). C—F bonds can be substituted for amino (contains an amine and carboxylic acid group). Alkyl (C—H bonds) and hydroxyl. In experiments XPS (ESCA) shows that using $CF_4$ gives a high level of fluorination after a short time (30 minutes gave 14.1%).

Fluorinating before treating with $NH_3$ increases the $NH_3$ functionalisation by providing access sites for substitution-in of amine groups. The fluorine is also expected to react with epoxy hardener at high temperatures with a catalyst.

Oxygen treatment at higher pressure (0.6 torr/80 Pa) and longer time favours the formation of carboxylic groups on CNTs and graphite platelets.

Fluorine+oxygen: fluorine can readily be displaced by carboxylic acid groups.

Argon and nitrogen are known to show 10% nitrogen and 8% oxygen, amine peak (3.9%). Oxygen and amidation (COOH)+$NH_2$—R—$NH_2$ (e.g. ethylene diamine) creates an amide linkage C—NH—R—$NH_2$ Oxygen treatment followed by Ammonia.

Oxygen treatment, C═O bonds form (more common than COOH), and react with $NH_3$ (ammonia). Also gives C—$NH_2$+$H_2O$ (gives an amide linkage). Oxygen+ethanolamine (COOH+OH—R—NH2═C—O—C—R—NH2) Oxygen+ethylene diamine. (COOH+OH—R—NH2═C—O—C—R—NH2). Hydrogen peroxide will contain the oxygen and hydrogen needed to create COOH and OH groups.

The plasma treatments allow ready control of the % functionalisation of available sites on the carbon, by adjusting the gas concentrations and treatment times. This is very important in achieving practical dispersibility of a given material in a given polymer. The effect of admixture of a given particulate by way of viscosity change in the polymer matrix depends very strongly on both its specific surface area and the % functionalisation of its surface. Conventional methods are unable to control these things reliably, whereas the present methods can.

End Uses: Composites and Devices/Articles

In photovoltaic devices, ITO (indium tin oxide) is the industry standard material blended in the polymer matrix of the device layers to make them electrically conductive. Graphene or few-layer graphitic platelets will naturally offer excellent conductivity in-plane, provided that they can be dispersed in the polymer matrix. We find that the few-layer graphitic platelet materials of our invention in fact also offer satisfactory transparency, so they can be used in this very important technical area e.g. as a substitute for ITO.

Independently, there is general value in being able to incorporate nanoscale particles (particles having at least one dimension less than 100 nm) of any type, e.g. CNTs such as SWCNTs or MWCNTs, nanorods (non-hollow), nanosheets or nanoplatelets such as graphitic platelets, effectively into a matrix material such as a matrix polymer. These are desirably carbon or carbon-based. To achieve effective dispersion it is necessary that the nanoscale particles are sufficiently deagglomerated or non-cohering that they can be initially dispersed in the matrix, and also that the chemical nature or compatibility of the nanoparticle surfaces relative to the matrix material is such that they remain stably dispersed e.g. as a substantially discontinuous and/or substantially uniformly dispersed phase, and desirably without significant agglomeration or re-agglomeration of the particulate in the composite. Again this may require controllable functionalisation of the particle surfaces.

The treated particles have a wide range of uses. In one preferred embodiment the particles, treated or produced by the present methods, are incorporated into a polymeric matrix. This polymeric matrix may be, or may form the basis of, a specialised functional component such as a conductive plastics component, or an electro-functional organic component or material, such as a photovoltaic element or layer, or a structural component in which the dispersed nanoparticles such as graphitic platelets and/or CNTs provide additional strength.

Other applications for particles which have been processed according to the present method are in inks, paints, coatings or laminar materials. A masterbatch of a corresponding liquid containing the particles may be prepared e.g. in the treatment vessel containing the activated particles.

A liquid introduced into the vessel for dispersal of the particles may be a curable polymer composition, or component or precursor thereof.

Since the particles tend to carry the same electrical charge, they naturally tend to self-disperse in a fluid or liquid matrix, vehicle or carrier.

An alternative to the use of liquid is to store the particles at low temperature, e.g. under liquid nitrogen, to minimise chemical reaction with the activated particles. This may be done in the same vessel.

Plasma Treatment Features

In WO2010/142953 were proposed particular modes of low-pressure (glow) plasma treatment as a means of providing chemical activity of CNTs and other small particles and dispersing them. Certain general methods and apparatus from WO2010/142953 are applicable herein, e.g. as follows.

Particles are put into a vessel, the vessel is closed and the particles are subject to plasma treatment by generating plasma inside the vessel. The plasma treatment involves positioning electrodes at opposing positions in relation to an interior space of the vessel, and generating plasma between the electrodes in a region inside the vessel.

In a preferred embodiment one electrode extends into an interior space of the vessel to be surrounded by the space, e.g. as a central or axial electrode, and another electrode is an outer or surrounding electrode. The outer wall of the vessel is desirably cylindrical, or circular in cross-section. It may be or may comprise the counter-electrode. The vessel is desirably in the form of a drum.

In one preferred embodiment an interior e.g. axial electrode is, or comprises, or is positioned in, a re-entrant portion or socket formation of the vessel wall. For example a re-entrant portion of the vessel wall may extend axially, as a hollow formation, through the middle of the vessel space. It may be (or comprise) a dielectric vessel wall portion, or a conductive vessel wall portion. To generate plasma, a central electrode connected to an electrical driver can be connected to or inserted into this central re-entrant electrode or electrode cover of the vessel. A counter-electrode is positioned around, outside or surrounding the vessel wall. Application of an electric field between the electrodes generates plasma in the vessel.

It is preferred that the plasma treatment is by means of low-pressure plasma of the "glow discharge" type, usually using DC or low-frequency RF (less than 100 kHz). [Alternatively microwaves may be used, which case the specified electrode structure may not be needed.] The pressure in the vessel for the treatment is desirably less than 1000 Pa, more preferably less than 500 Pa, less than 300 Pa and most preferably less than 200 Pa or less than 100 Pa. For the treatment of CNTs and graphitic particles especially, pressures in the range 0.05-5 mbar (5-500 Pa) are usually suitable, more preferably 0.1-2 mbar (10-200 Pa).

To generate low-pressure or glow plasma, the vessel interior needs to be evacuated. An evacuation port may be provided for this purpose, and in the present method is connected to an evacuation means via a suitable filter for retaining the particles. The filter should be selected as regards its pore size to retain the particles in question, and as regards its material to withstand the processing conditions and to avoid undesirable chemical or physical contamination of the product, depending on the intended use thereof. For the retention of particles, HEPA filters, ceramic, glass or sintered filters may be suitable depending on the size of the particles. The evacuation port may be in a main vessel wall or in a lid or cover.

During the plasma treatment, the vessel is desirably agitated or rotated to cause relative movement of the particles inside. This may include movement of the particles falling through the vessel space, through the plasma zone. The treatment vessel (defining the treatment chamber) may be rotated around an axis, e.g. an axis of an internally-projecting electrode as mentioned above.

In a low-pressure plasma treatment system, application of vacuum is desirably combined with a feed of gas for plasma formation, so that the treatment atmosphere can be controlled and, if necessary, contaminated or spent treatment gas removed during the process. Again, this gas feed may be through a particle-retaining filter built into the wall of the vessel. One suitable place for a gas feed filter is in a re-entrant electrode or electrode cover portion as mentioned above.

The above-mentioned internally-projecting electrode portion, or electrode cover portion into which an external electrode is inserted, may itself be detachably inserted into the vessel body. This may be by means of a screw thread, ground joint, plug fit or other suitable sealed union. The joint should be able to prevent escape of particles. This electrode portion or electrode cover portion may be generally tubular. It may be cantilevered, or may bridge between opposed walls. When cantilevered, a gas inlet filter may be positioned at a distal end thereof.

The vessel may be provided with a removable or openable sealable lid or closure, e.g. to cover a main opening through which particles may be loaded into and/or unloaded from the vessel interior. The vessel wall e.g. lid may incorporate a port for the application of vacuum, e.g. including a filter as mentioned above. The vessel wall e.g. lid may incorporate a port for the injection of reagent or gas for chemical treatment.

An electrode or electric supply of the plasma treatment apparatus may be inserted into or connected to a re-entrant electrode or electrode cover formation of the vessel. If the re-entrant formation is itself conductive, then it constitutes an electrode when the system electrode is connected to it. If the re-entrant formation of the vessel comprises or constitutes an electrode cover of dielectric material, e.g. glass, then the inserted system electrode needs to fit closely within it to avoid the generation of undesired plasma in gaps between these components. A system electrode in rod or tube form is then desirable, fitting into an elongate tubular cover.

An external or counter-electrode may be an external conductive drum or housing. It may be or be incorporated into an outer wall of the treatment vessel itself, e.g. a drum wall. Or, it may be a separate rotatable treatment drum for a plasma apparatus, inside which the treatment vessel containing the particles can be supported to rotate with the drum.

The wall of the treatment vessel or drum may have lifter formations, such as paddles, vanes, baffles, recesses, scoops or the like which are shaped and dimensioned so that, as it is rotating at a pre-determined operating speed, with a mass of particles for treatment contained in the treatment chamber, particles are lifted by the drum wall formations from a lower region of the chamber and released to fall e.g. selectively along a path passing through the plasma zone adjacent the axial electrode. These formations may be integral with or fixed to the vessel wall. They may be of conductive or of non-conductive (dielectric) material. However when contact bodies or contact formations are used they may be unnecessary, because the contact bodies/formations may have their own plasma "haloes", and with heavy or dense bodies falling may be undesirable. Mild agitation of a mass of the contact bodies with the particles for treatment, e.g. at the bottom of a rotating, oscillating, reciprocating or vibrating vessel or drum, gives good results.

By experimentation we have found however that with the alternative set-up, in which plasma in a rotating drum is localised along a generally axial region, and the drum wall is formed and the drum rotated in such a manner that the particles fall preferentially through that region, in conjunction with the use of a low-pressure discharge plasma, useful particle treatment can be achieved especially for activation or functionalisation, or for moderate disaggregation, even without contact bodies where e.g. exfoliation is not a requirement. This is reflected in improved performance of the resultant population of particles.

The size of the particle charge in the drum is not critical. Typically it occupies less than 25% and preferably less than 15% of the available volume in the treatment chamber (assessed with the particles in a loose bed e.g. immediately after loading or after rotation ceases).

A further proposal relates to a manner of feeding gas to a treatment chamber for the formation of low-pressure discharge plasma adjacent the elongate electrode. It is desired to provide conditions in which the treatment chamber is subjected to ongoing, and preferably continuous, evacuation of gas, e.g. to a vacuum pump via a suitable filter to retain particles in the chamber and protect the pump. This can have the important function of progressively clearing from the treatment chamber the products of chemical degradation and volatilisation, which otherwise tend to accumulate on the product or on the apparatus components. A feed of clean gas is needed to compensate for the evacuated gas in this flushing operation. For many purposes, including surface activation of particles, the specific nature of the gas is not critical provided that it can sustain plasma. Oxygen-containing gases and especially air are suitable and economical.

Fresh gas may be injected into the chamber through a gas injection structure or distributor, e.g. on or adjacent an electrode in the interior e.g. along an axis of the chamber.

It is desirably arranged that the axial electrode be removable, e.g. detachable from an opening in an end wall of the treatment drum, to facilitate cleaning and processing.

The size of the treatment drum is not particularly limited. We envisage that it may be anything from 1 liter upwards.

While a central electrode is preferred, and various of the above proposals relate to such an arrangement, it is also possible to carry out the plasma treatment in a rotating drum of the kind described but creating the axial or central plasma region by other means e.g. by a magnetron and wave guide.

The treatment time is not particularly limited, and can readily be determined and optimised by testing according to the materials involved, the plasma conditions and the intended end-use. For activation or brief functionalisation a treatment time (that is to say, for operation of the drum with the plasma active and the particles moving in it) of from 30 to 500 seconds is often effective. However for disaggregation and especially exfoliation of graphitic particles, and/or more thorough functinalisation, more time is needed and generally the longer the better: usually at least 10, at least 20 or at least 30 minutes and maybe an hour or more.

Contact Bodies/Contact Formations

As mentioned, it is strongly preferred to use the following process features which have been found notably effective in disaggregating particles, e.g. CNT-containing particles, and in exfoliating graphene or few-layer graphitic sheets from graphitic particles, e.g. particles as produced by the known "bulk" methods such as vapour-deposition onto catalyst and arc discharge, or (for graphene) natural graphite particles, or graphite fibres.

In this aspect the above-defined particles to be treated ("the particles") are subject to plasma treatment under agitation, e.g. as described above, in a treatment chamber having a plasma zone where plasma is formed in use. The treatment chamber contains or comprises multiple solid contact bodies or contact formations. These are electrically conductive, or have electrically conductive surfaces, and contact the particles as they are agitated.

In preferred procedures the contact bodies are movable or mobile, preferably freely movable, in the chamber and are agitated together with the particles. This may be agitation by rotation and/or tumbling in a treatment drum as proposed above. Or it may be non-fully-rotatory e.g. reciprocating agitation. The contact bodies may gather electrical charge at their surfaces by contact with an electrode comprised in the treatment chamber e.g. in an outer vessel or drum wall, or assume the voltage thereof relative to another electrode, and/or by passing through the plasma zone.

The contact bodies may be of any suitable shape. Balls are preferred because the symmetry of the surface gives an even distribution of electrical field-related phenomena. Other shapes with circular symmetry, cuboids or polyhedra may also be used. The size is not critical, but preferably they are much larger than the particles being treated. Usually they are at least 1 mm, at least 2 mm or at least 5 mm in maximum dimension (e.g. diameter). Usually the maximum dimension (e.g. diameter) is not more than 100 mm, or not more than 60 mm, or not more than 40 or 30 mm. With smaller bodies the field intensity can be greater.

The material of the bodies is not critical. For electrical conductivity of the surface a conductive coating such as a metal coating on an insulating body will serve. However this accumulates less charge, so the adjacent field is less in use. Bodies made entirely of conductive material generally give a higher field. They may be of metal or of conductive compound such as metal carbide or metalloid. Simple steel balls are very effective, although they are liable to corrosion in air after having been exposed to plasma. Use of more chemically inert conductive materials, such as non-ferrous carbides can reduce this issue. Conductive ceramics are a further possibility.

The material of the contact bodies should be selected so as not be substantially destroyed or disintegrated by the treatment environment. Equally materials are preferably avoided which contain substantial levels of components liable to vaporise from the bodies' surface under the treatment conditions and deposit on or otherwise contaminate the liberated particles of the product, unless this is intended for some special reason.

The agitation of particles with contact bodies appears at first sight analogous to ball or bead milling, which has previously been considered as a means of breaking up aggregate particles. However ball and bead milling are in fact found to be essentially ineffective for this with particles of the kind described. Indeed, when we repeated our experiments (described later) with the contact balls but without the plasma turned on, negligible effect was found. Conversely the mere tumbling through plasma, although effective, is far less effective for disaggregation and exfoliation than the combination with contact bodies. The present method using plasma and agitated mobile conductive bodies in combination achieves remarkably good results.

Nevertheless the co-agitation of the contact bodies provides mixing, promoting contact of substantially all particles in the charge with the active charged surfaces of the bodies during the treatment period.

The number of bodies depends as might be expected on their size, material, the treatment time, the amount of material to be treated etc. Desirably they form a bed—at least when static and preferably also when agitated—deep enough to incorporate the charge of particles being treated, at least at the beginning of the treatment (graphite particles and agglomerated CNT particles for example expand very greatly during the treatment as they are disaggregated or exfoliated and may rise above the contact bodies after having previously been lost among them).

In an alternative embodiment the contact of the agitated particles is with contact formations connected to the treatment vessel or mounted at a fixed position therein, e.g. an array of inward finger projections from the wall thereof through which the particles tumble, or a grid or lattice or other fine structure in which the particles can mix and move under agitation, and which are connected so as to be electrostatically charged or to assume the relative voltage of the adjacent vessel wall or electrode component. desirably plasma glow forms at the surfaces of the contact bodies or contact formations and this treats the particles.

The first aspect above requires conductive bodies. However a combination of ball or bead milling with plasma treatment in the same chamber is also novel and more effective than either measure taken alone, and so is an aspect of our new proposals even if non-conductive contact bodies are used.

We find that the use of plasma treatment is effective to remove some contaminants, and in particular amorphous carbon and residual post-production contaminants such as catalysts, more gently than by the known acid washing methods i.e. with less damage to the regular particle structure.

After treatment the disaggregated particulate product has been found to exhibit various advantageous properties. One important property is specific surface area, which can be determined by the standard BET or NMR methods. Conventional treatments applied to aggregate CNT particles struggle to achieve BET specific surface areas better than 50 $m^2/g$ in the product material, because of the great tendency to maintain aggregation. We find that CNT granules treated by the present methods can give materials with BET specific surface areas of at least 300, at least 500, at least 800 or at least 1000 $m^2/g$. These materials are believed to be new per se in the context of bulk production methods, and they are an aspect of the present invention. Methods comprising synthesising CNTs or graphitic particles and then applying the present methods to disaggregate or exfoliate the particle product are a further aspect of the invention. Methods in which the disaggregation or exfoliation treatment is followed by dispersion of the material in a liquid vehicle or matrix material (or matrix material precursor) are a further aspect of the invention. This dispersion may involve the use of one or more dispersants such as surfactants, or polymeric materials whose molecules associate themselves with the individual dispersed component particles e.g. separated CNTs or graphene sheets, to inhibit their re-aggregation in the liquid.

BRIEF DESCRIPTION OF THE DRAWINGS

The present proposals are now explained further with reference to the accompanying drawings, in which:

FIGS. 8 to 16 show details of actual carbon materials before and after treatment in accordance with the new proposals:—

FIGS. 8 and 9 are SEM images of a MWCNT material before treatment;

FIGS. 10 and 11 are SEM images of the same MWCNT material after treatment;

FIGS. 13 and 14 are SEM images of a disordered graphitic or graphene material made by arc discharge, before and after treatment;

FIGS. 15 and 16 are SEM images of a natural graphite material before and after treatment.

DETAILED DESCRIPTION

Figure 1:
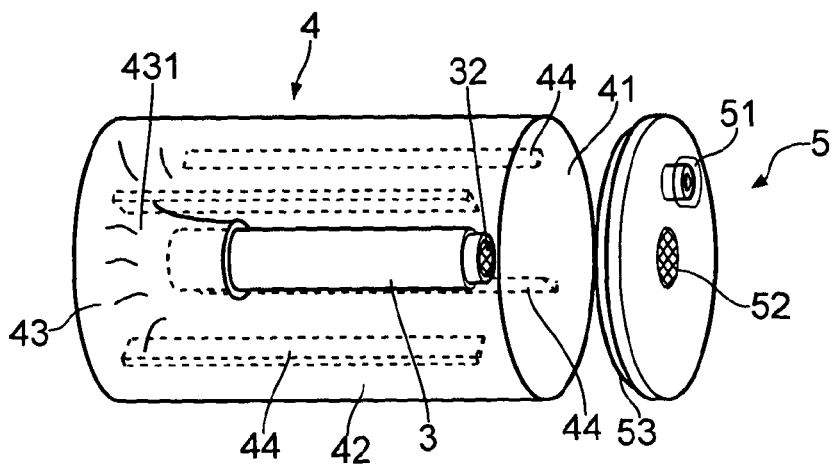
FIG. 1 is a perspective view of a treatment vessel.

With reference to FIG. 1 a generally cylindrical glass vessel or drum 4 has an integral glass rear end wall 43 and a front opening 41. Quartz or borosilicate glass is suitable. Axially-extending rib formations 44 are distributed circumferentially and project inwardly from the interior surfaces of the drum wall 42. They may be formed integrally with the glass of the wall, or be bonded-on plastics components.

Figure 2:
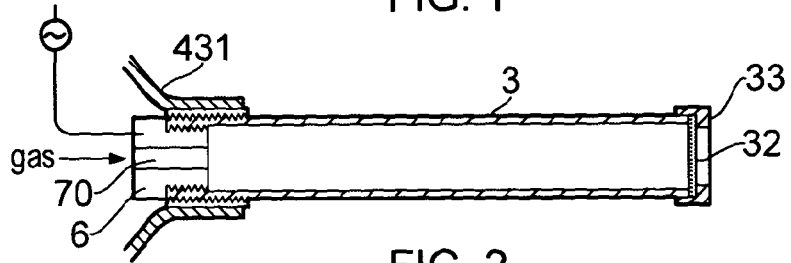
FIG. 2 is a schematic view of a central electrode formation in one version.

The rear wall 43 has a central re-entrant portion or socket 431 forming an insulative locating support for an electrode formation extending forward axially through the drum interior. This formation may be a fixed metal electrode insert, as exemplified in FIG. 2. The embodiment of FIG. 2 is a tubular electrode with a gas feed port via a fine filter disc 32 closing off its front (free) end e.g. clamped by a screw ring cap 33. Its open rear end is sealingly bonded, or more preferably sealingly but removably connected (e.g. by a thread or tapered plug as shown), into a central opening of the glass socket 431.

Figure 3:
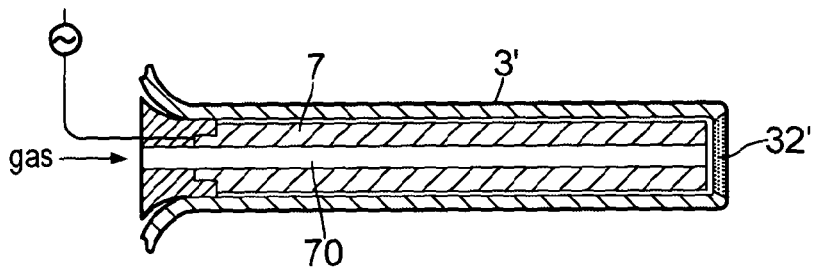
FIG. 3 is a schematic view of a central electrode formation in another version.

Alternatively the interior electrode formation may be or comprise a dielectric electrode cover, e.g. an integral tubular forward extension 3' of the glass wall itself as shown in FIG. 3, having a fine particle filter 32' e.g. of sintered glass or ceramics at its front end. An alternative has a discrete tubular dielectric electrode cover element fixed or bonded in, like the electrode of FIG. 2.

An advantage of removable electrodes/electrode covers is ease of cleaning, replacement or substitution with different ones e.g. of different size, material, filter type etc.

A plastics sealing lid 5 is provided for the open front end of the glass treatment vessel. This lid has a peripheral sealing skirt 53 to plug tightly into the drum opening 41, a filter port 52 incorporating a HEPA filter element, for pressure equalisation with a vacuum system, and a fluid injection port 51 having a sealing cover, for the introduction of liquid.

In use, a charge of particles is put into the vessel 4. The lid 5 is sealed. The HEPA filter 52 is sufficiently fine that the particles cannot escape, and can in any case be covered with a seal as a precaution against damage. The particle-loaded vessel is sent for plasma treatment using plasma-generating apparatus having a treatment chamber with vacuum generation, plasma-forming gas feed, means for rotating the vessel and system electrode drive for generating a suitable electric field for plasma generation, e.g. RF energy.

In the case as in FIG. 2 where the electrode 3 is integrated, it is necessary to connect this by a suitable connector, e.g. a threaded element 6 with a gas feed conduit 70, to the electrical drive. Of course, this connector could alternatively extend further into or all along inside the tubular electrode 3. However the connector is in any case removably or releasably connected.

In the case as in FIG. 3 where the drum comprises a dielectric electrode cover 3', an elongate electrode 7 of the plasma-generating apparatus is inserted, fitting closely to avoid intervening space (the slight clearance in the drawing being only to indicate the discrete parts).

A central gas feed channel 70 can be provided inside the connector 6 or electrode 7, for feed of gas to the vessel interior via the filter 32,32' at the front end of the electrode.

Figures 4, 5:
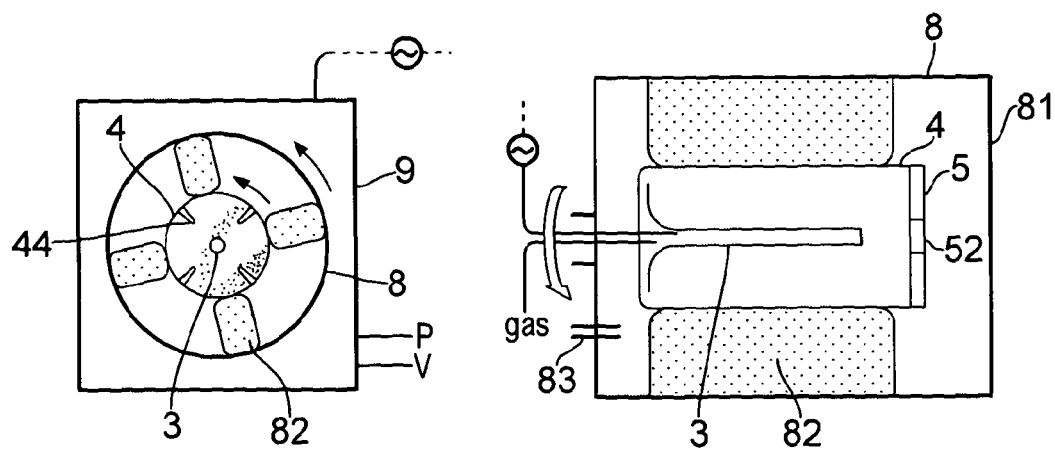
FIG. 4 is a schematic end view of the treatment vessel operating in plasma-generating apparatus.
FIG. 5 is a side view of the same thing.

FIGS. 4 and 5 show a plasma treatment apparatus schematically: a support container 8 is mounted rotatably in a fixed sealable housing 9. Either of these or part thereof may comprise the counter-electrode. The counter-electrode should be shaped and positioned in relation to the axial electrode to enable stable glow plasma to form substantially all along the axial electrode inside the treatment chamber. The particle treatment vessel 4 is loaded into the support container 8 through a front hatch 81, and held axially in position by locating pads 82, and by connection of the axial electrode at its rear end. The housing 9 is evacuated via an evacuation port V, and the vacuum applies through the system via container vacuum port 83 and the front filter port 52 of the treatment vessel. Gas is fed in axially via the filter 32,32' in the electrode formation. Application of RF or other suitable power according to known principles creates plasma in the vessel 4, especially in the region adjacent the axial electrode formation 3. As the drum rotates (FIG. 4) the internal vanes 44 carry the nanoparticles up and cast them down selectively through this plasma-rich zone.

The treatment atmosphere may be chosen freely provided that it will sustain plasma. An oxygen-containing atmosphere is an example, and is effective to produce oxygen-containing functional groups on the particles, thereby activating them.

Thus, the treatment vessel 4 can be plugged into a plasma apparatus and operated to plasma-activate the particles without ever needing to be opened. After treatment, the liquid introduction port 51 can be used for the injection of a suitable liquid to disperse and/or carry the particles. This might be e.g. a solvent vehicle, water or polymer material.

For the injection of process gas the treatment chamber may be provided with more than one gas injection point (e.g. different points in the housing or drum and/or different options for injecting gas at or along the central electrode). The appropriate point can then be selected to produce effective treatment according to the material to be treated.

The rotation speed of the treatment drum is adjustable so that the particles can be made to fall selectively through the glow plasma region.

The drum may be formed in various ways. One possibility is a conductive drum wall itself forming a counter-electrode for plasma formation. Front and back end plates may be dielectric. A further possibility is a fully dielectric drum, with a separate counter-electrode structure or other plasma energising structure. This structure may be an external housing.

Glass is a suitable and readily available dielectric material for forming any of the baffles, drum end plates and drum wall. Plastics or ceramic materials may also be used.

Second Apparatus Embodiment

Figure 6:
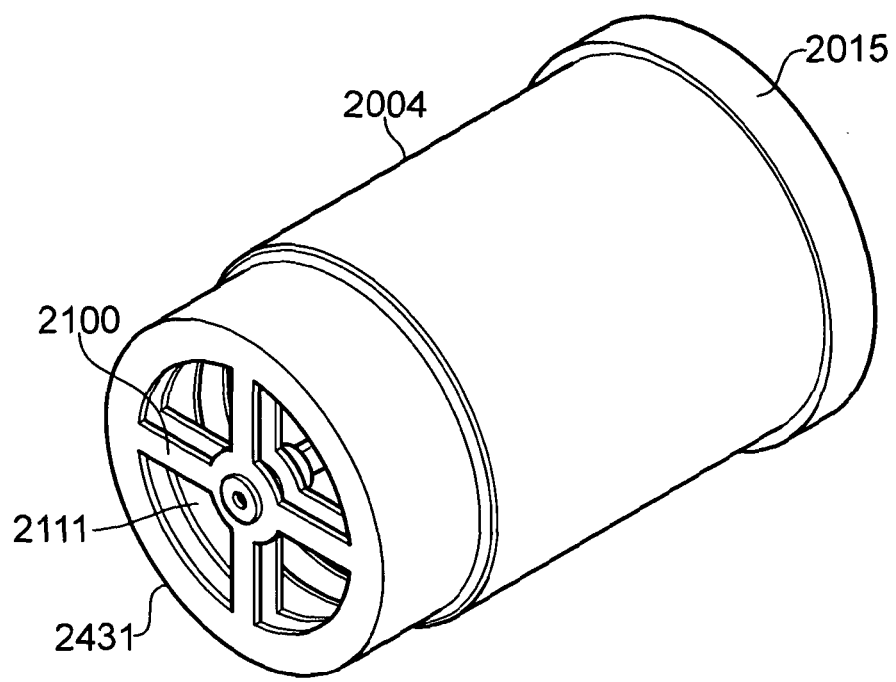
FIG. 6 is a perspective view of a further embodiment of treatment drum.
Figure 7:
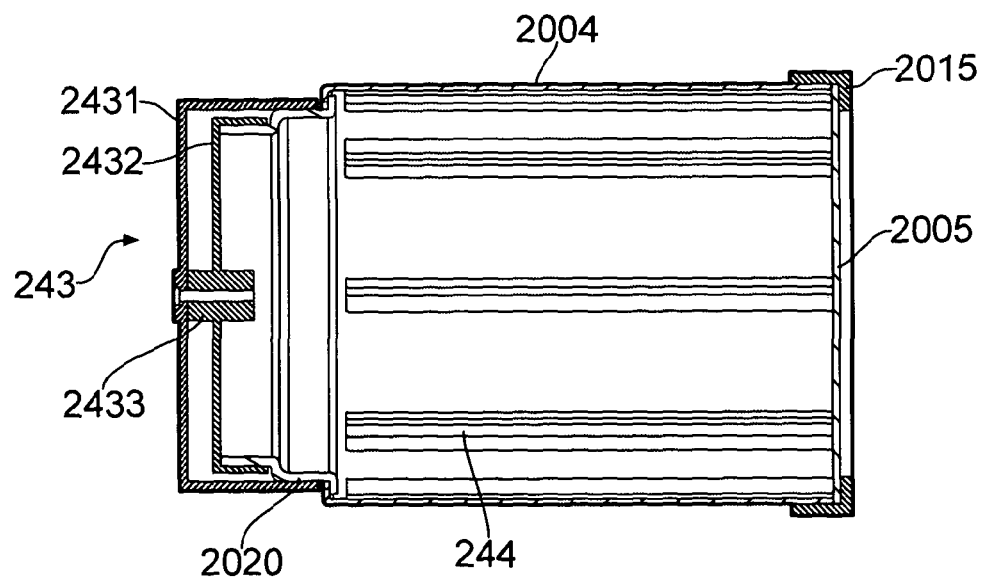
FIG. 7 is an axial cross-section thereof.

FIGS. 6 and 7 show a further treatment drum suitable for treatment of particles comprising CNTs, or graphitic granules. It has a cylindrical drum wall 2004 of metal e.g. steel or aluminium to act as counter-electrode. It is to be mounted for rotation in a vacuum chamber, e.g. on support rollers.

The end walls are insulative. A rear end wall is of glass or inert plastics e.g. PTFE and comprises inner and outer layers 2432,2431 between which a filter layer (not shown) is clamped. This end wall filter module has large windows 2111 occupying more than half its area so that gas flow speed through the filter is low. This is found to improve plasma stability i.e. inhibit arcing. The centre of the rear end wall has a holder for the axial electrode, not shown. The electrode is a tubular metal electrode along which process gas is fed in use. It may be housed in a sheath.

A set of eight non-conductive (plastics) lifter vanes 244 is mounted around the inside of the metal drum. The front end wall has a simple insulating sealing wall or lid held on by a tight collar which may optionally—as may the module at the rear end—be screwed onto the metal drum end.

Third Apparatus Embodiment

Figure 24:
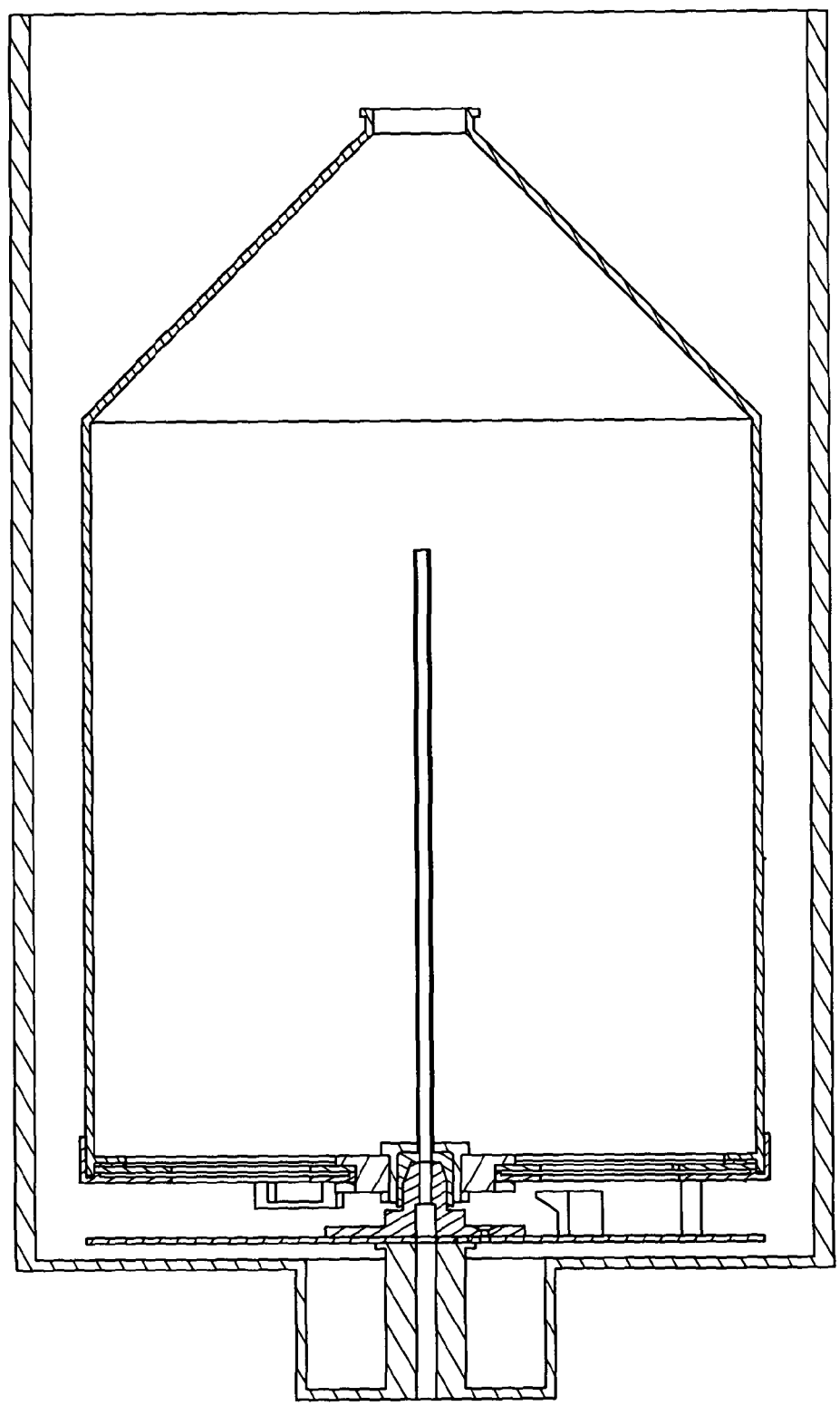
FIG. 24 shows a further version of treatment drum (3rd apparatus embodiment)

FIG. 24 shows a third embodiment of the treatment drum, in slightly more detail. This is a larger drum, volume about 60 liters and without interior baffles or lifters i.e. so that the bed of contact bodies e.g. steel balls will reside at the bottom during treatment. The tubular central electrode is used for feeding gas, through a brass sintered plug at the front end (not shown). The front wall is formed into a cone with a limited opening (having a window plug, not shown) to facilitate emptying out of product after treatment. The rear wall is a filter, as before. Elements of the mechanical drive, vacuum communication and gas feed are also shown, to assist the skilled reader. The gas flow through the large volume of the system is relatively slow, and we find there is no tendency for the very fine particulate product to escape through the filter i.e. the product is not "carried out" by gas flow.

EXAMPLES

Apparatus and Conditions

In experimental work we used a steel treatment drum substantially as shown in FIGS. 6 and 7 and also as shown in FIG. 24, without any internal lifter baffles. Internal volume about 12 liters, diameter 400 mm, central electrode diameter 3 mm, steel central electrode and with an observation window in the front wall. As contact bodies we used ordinary steel ball bearings: size 10 mm, weight 12 grams, number about 500. Each charge of starting material (aggregated or initial carbon particles to be treated) weighing about 100 grams was put in the drum with the steel balls and the lid closed. For the treatment, conditions in the drum were e.g. as follows:

| Gas atmosphere fed | Oxygen |
|---|---|
| Rate of gas flow | 1000 cm³ per minute |
| Pressure | 50 torr |
| Speed of drum rotation | 60 rpm |
| Voltage applied (plasma) | 100 volts |
| Period of treatment | 30 mins |

Best results were found at rotation speeds at which a mass of the particles being treated, mixed with the mobile bodies (steel balls), resides at the bottom of the drum as it rotates. At 60 rpm the bed of balls and particles is gently agitated but remains at the bottom of the drum.

Carbon sample materials used in Examples 1 to 3 were as follows.
(1) MWCNT material made by the CVD process, from Bayer;
(2) largely graphitic material produced by an arc discharge process, from Rosseter (Cyprus);
(3) natural graphite powder.

During the treatments we observed plasma-like light haloes around the steel balls, especially those at the top of the bed nearest the central electrode, as they tumbled in the drum with the carbon particles.

Particle sizes were measured in water dispersion (using the standard laser diffraction method) by a MasterSizer 2000 machine (Malvern Instruments, UK). (The skilled person will appreciate that this gives only relative measurements, because of the high aspect ratio of the product.) The SEM images are from a Hitachi S-4800.

Example 1

Figure 8:
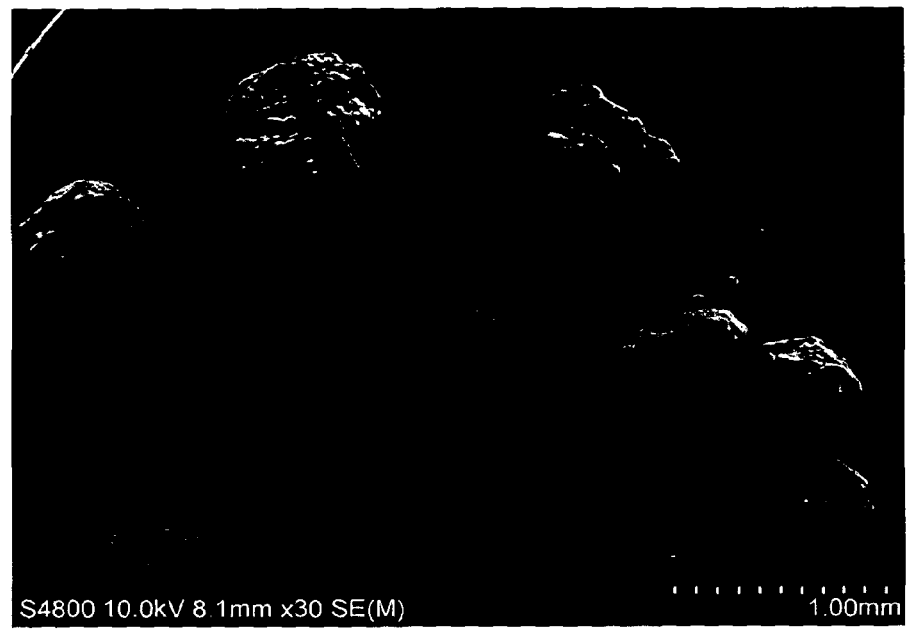
Figure 9:
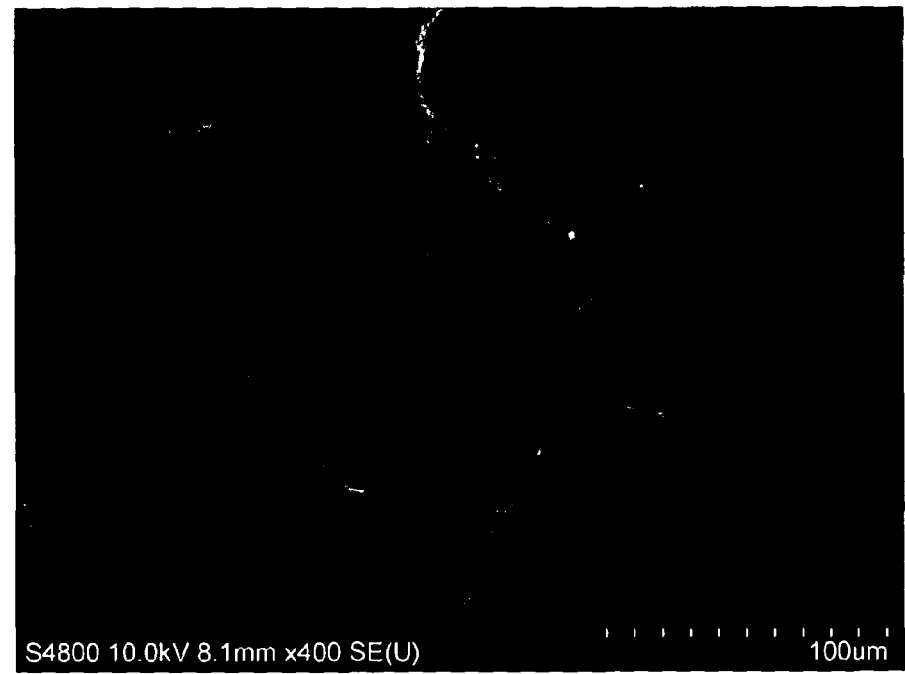
Figure 10:
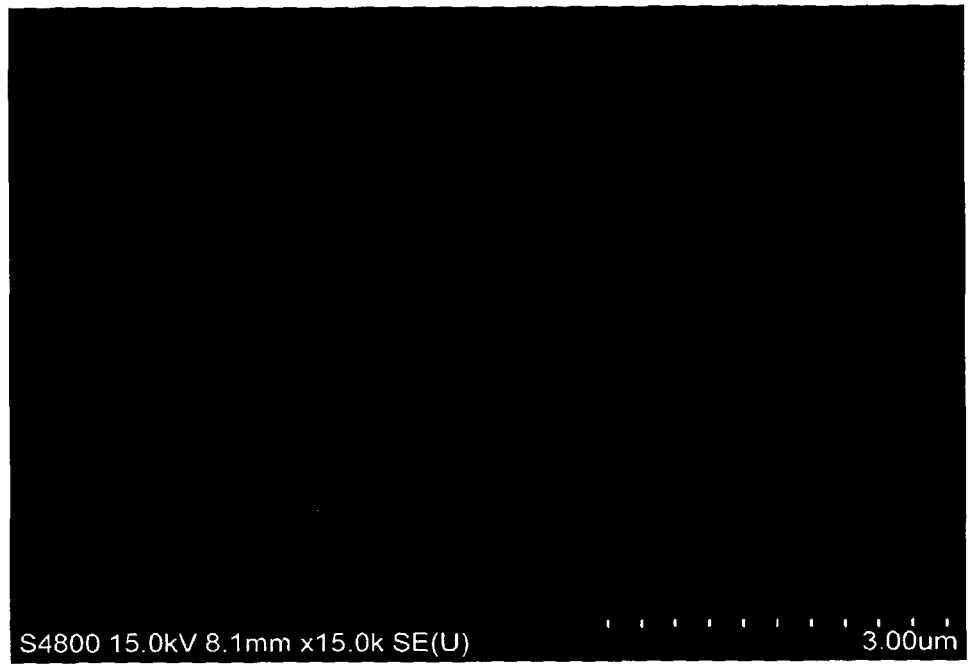
Figure 11:
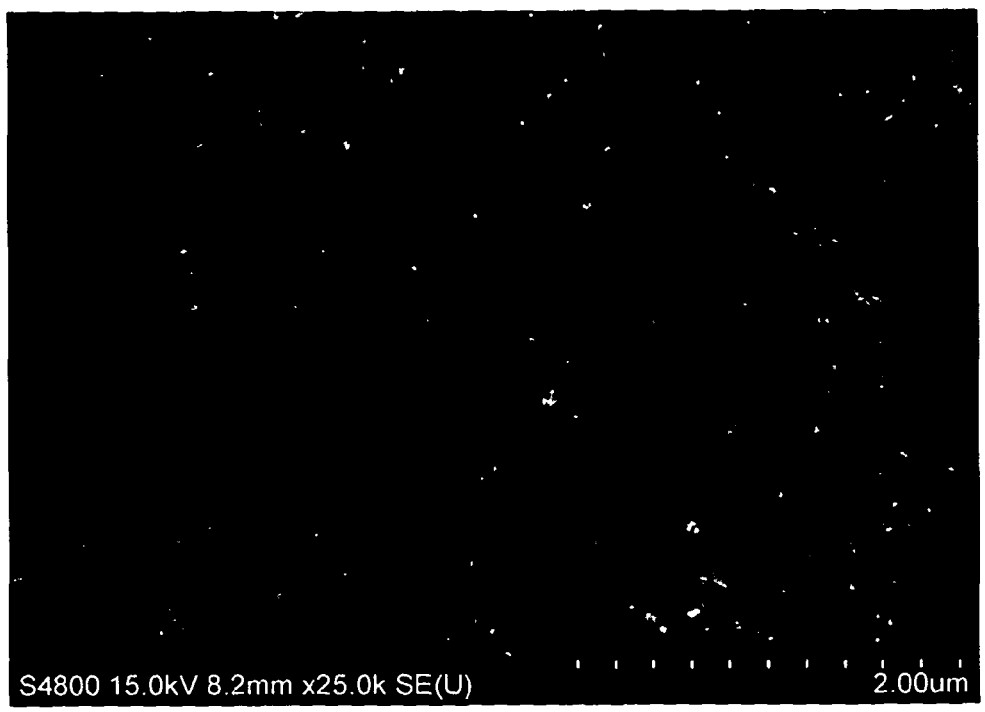
Figure 12A:
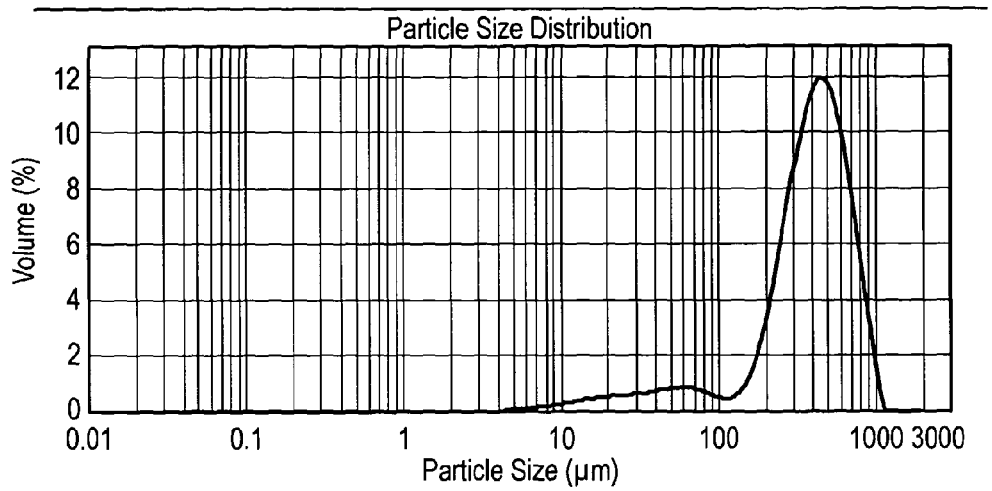
FIGS. 12(a) and 12(b) are particle size data for the MWCNT material before and after treatment.
Figure 12B:
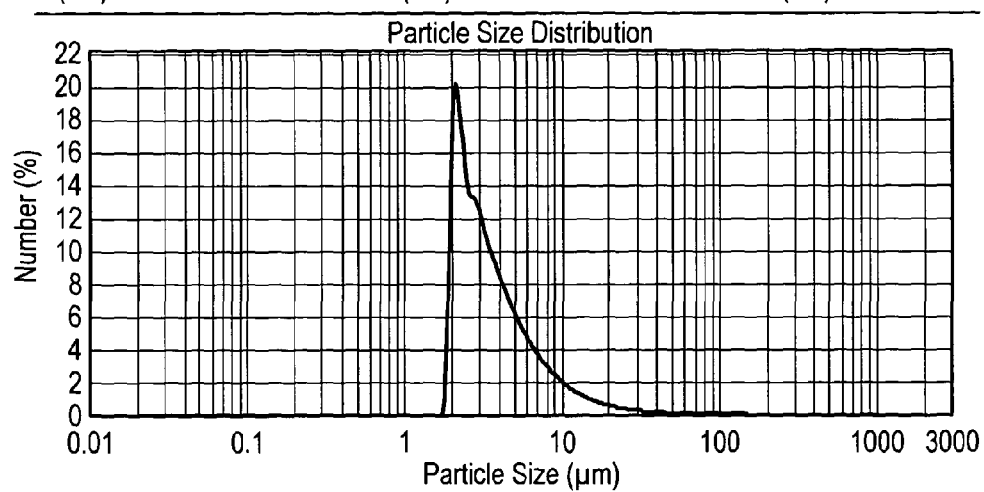

The MWCNT material as supplied, i.e. as manufactured, is seen in the SEM images FIGS. 8 and 9 and its particle size distribution is in FIG. 12(a). These are large, tightly aggregated granules approaching 1 mm (1000 μm) in size. The treated material is seen in the SEM images of FIGS. 10 and 11 and its particle size distribution is in FIG. 12(b). It can readily be seen that the particle size has been drastically reduced to a range between 1 and 10 μm, i.e. there has been substantial de-aggregation, and also that the treated material has a substantial proportion of discrete, liberated CNTs, visible in the SEM images.

Example 2

Figure 13:
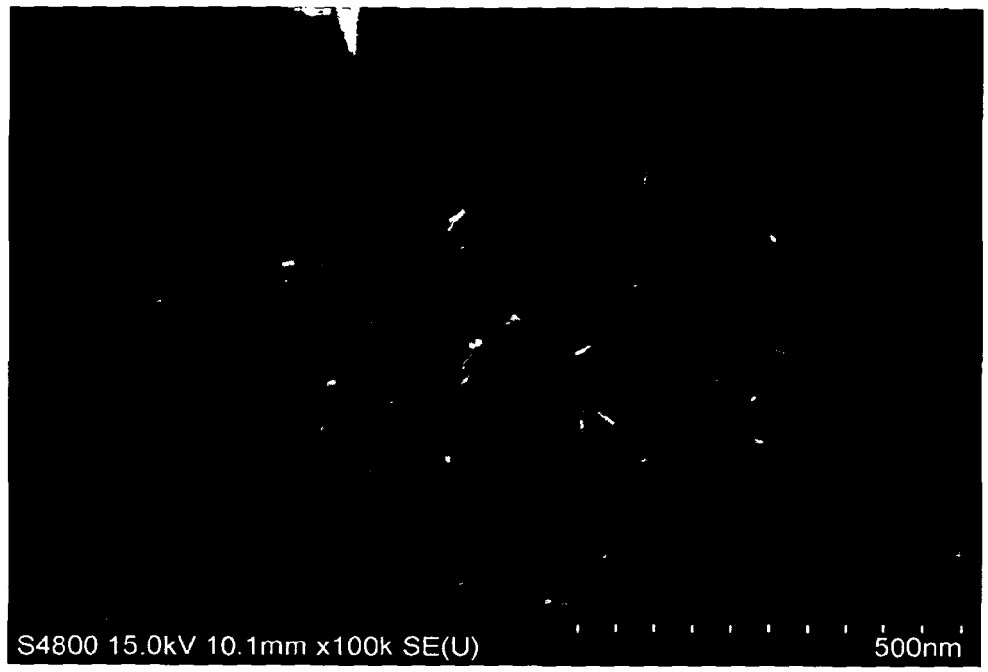
Figure 14:
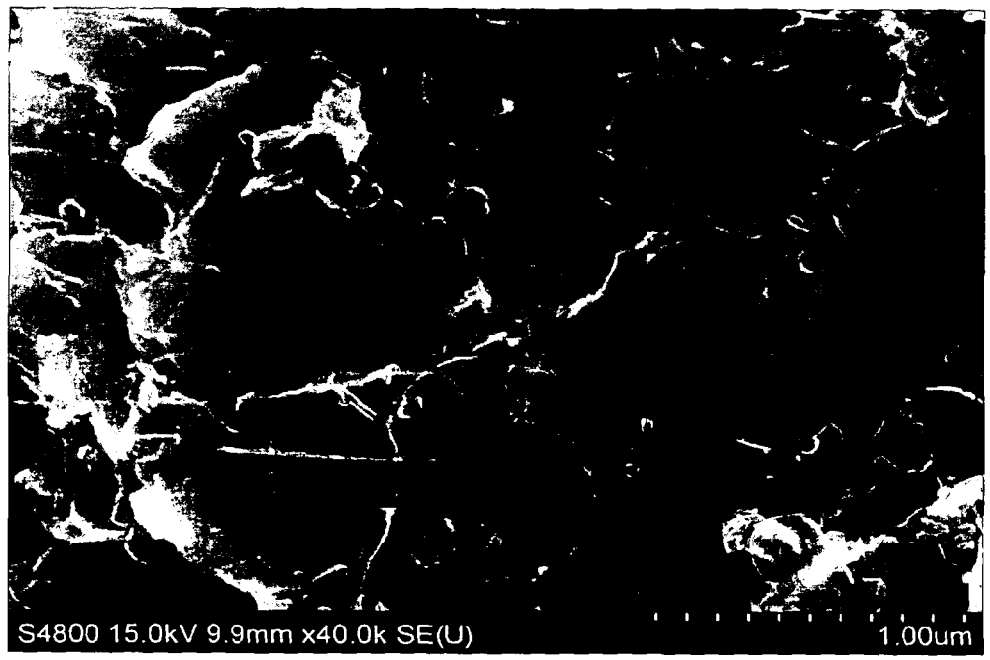

The starting material, consisting primarily of disordered, stacked graphite lumps and platelets with a few small fullerenes (FIG. 13), was subjected to the same treatment as described above. Portions of the treated material are seen in FIG. 14. It can readily be seen that there has been substantial thinning of the platelets, exfoliation of some graphene and reduction of size.

BET methods were used to measure the specific surface area, with a 2 hr degas at 300° C.:
treated=92 m²/g
untreated=62 m²/g
Increase=48%

Example 3

Figure 15:
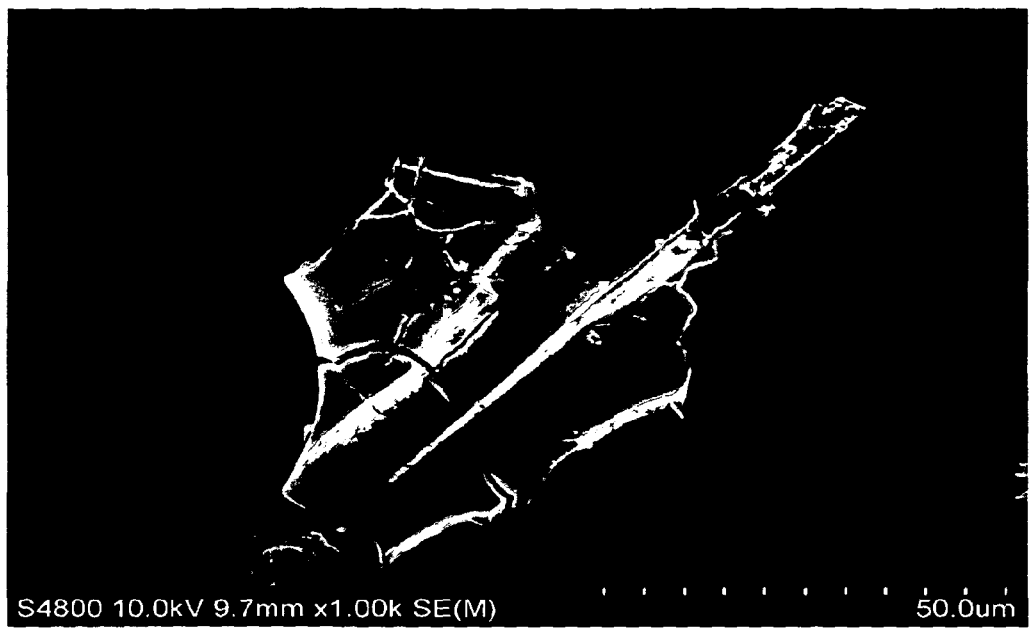
Figure 16:

The starting material was powdered natural graphite. FIG. 15 shows a typical particle: a graphite platelet with multiple layers which will not show the special properties of graphene. FIG. 16 shows the material after treatment. There has been substantial exfoliation, producing a large number of single graphene flakes. These can be functionalised at their edges, as is known.

Example 4

Figure 17:
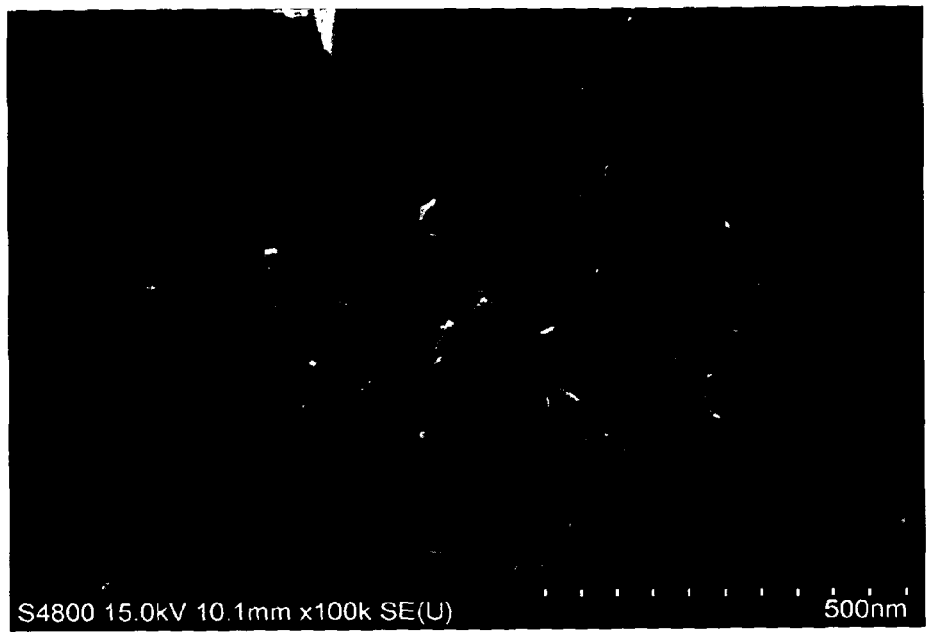
FIGS. 17 and 18 are SEM images of a disordered graphitic or graphene material made by arc discharge, before and after treatment.
Figure 18:
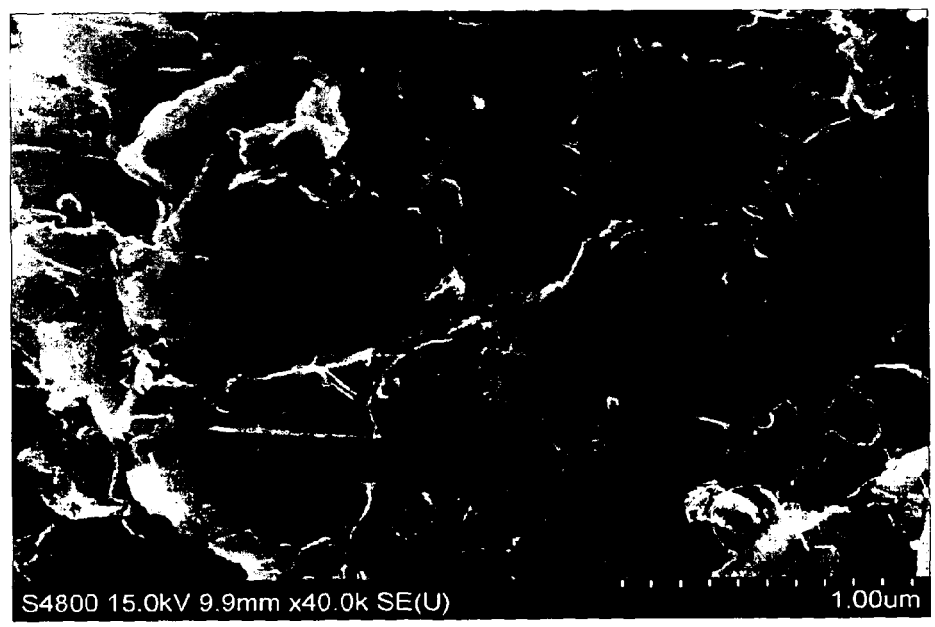

The starting material, consisting primarily of disordered, stacked graphite lumps and platelets with a few small fullerenes (FIG. 17), was subjected to the same treatment as described above. Portions of the treated material are seen in FIG. 18. It can readily be seen that there has been substantial thinning of the platelets, exfoliation of some graphene and reduction of size.

BET methods were used to measure the specific surface area, with a 2 hr degas at 300° C.:
treated=92 m²/g
untreated=62 m²/g
Increase=48%

Example 5

Figure 19:
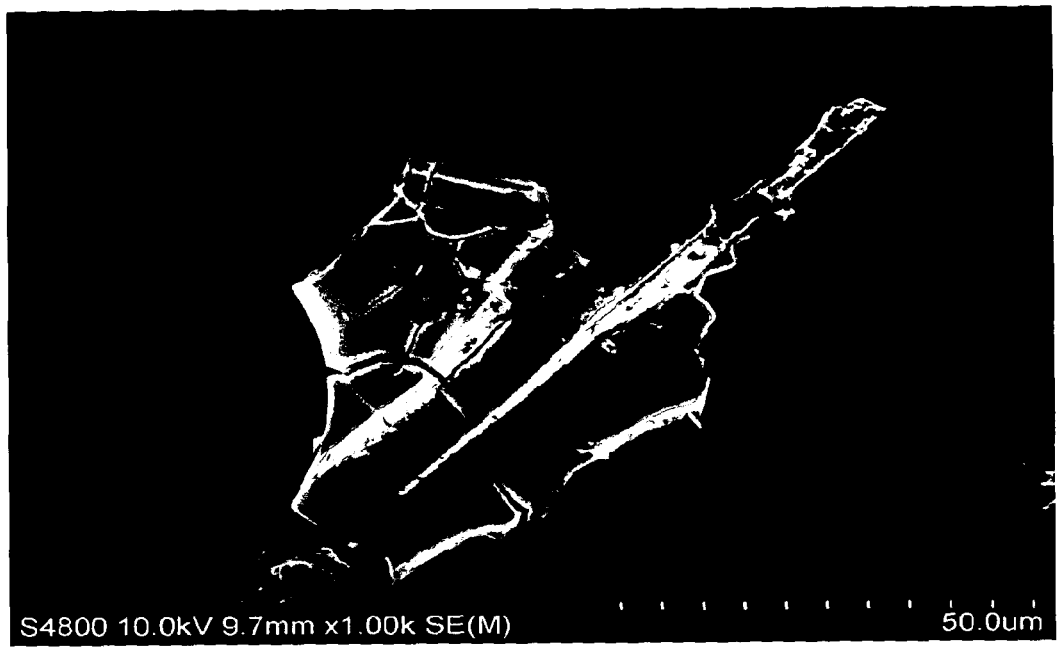
FIGS. 19 and 20 are SEM images of a natural graphite material before and after treatment.
Figure 20:

The starting material was powdered natural graphite. FIG. 19 shows a typical particle: a graphite platelet with multiple layers which will not show the special properties of graphene. FIG. 20 shows the material after treatment. There has been substantial exfoliation, producing a large number of single graphene flakes. These can be functionalised at their edges, as is known.

Example 6

Figure 21:
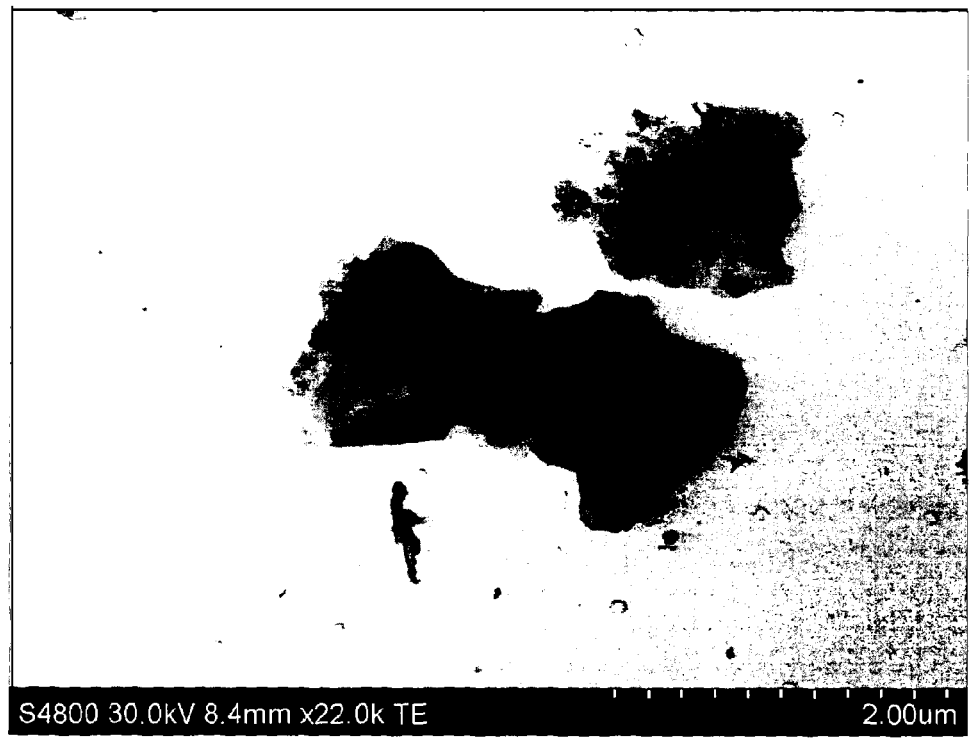
FIGS. 21 and 22 are face views and an edge view of product obtained in Example 6.
Figure 22:
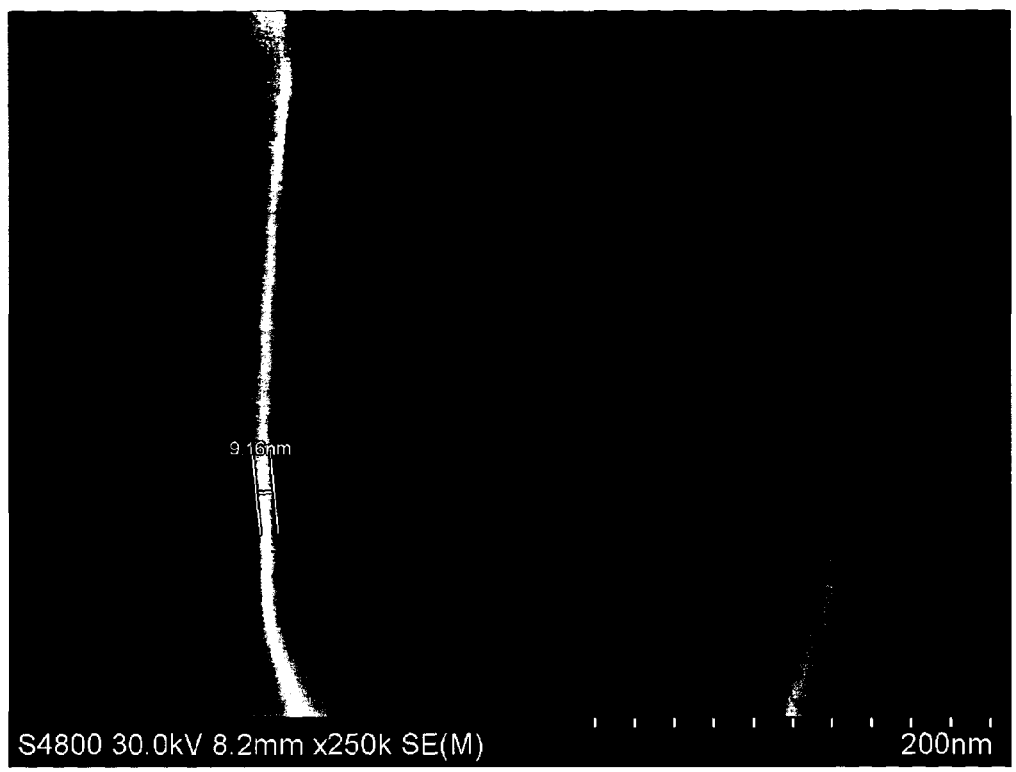

The starting material was powdered natural graphite of Chinese origin. FIG. 21 is a representative view of the treated product, with fully separated platelets. No measured platelet was thicker than 57 nm. Most were less than 25 nm thick. The thinnest was 2.7 nm.

This material, which carries oxygen-containing functionalities from the plasma treatment, was readily dispersed at 2 wt % in molten polyethylene which was then drawn into a yarn. In a qualitative laboratory comparison the filled yarn had much higher tensile strength than a yarn of the corresponding unfilled material.

Example 7

Figure 23:
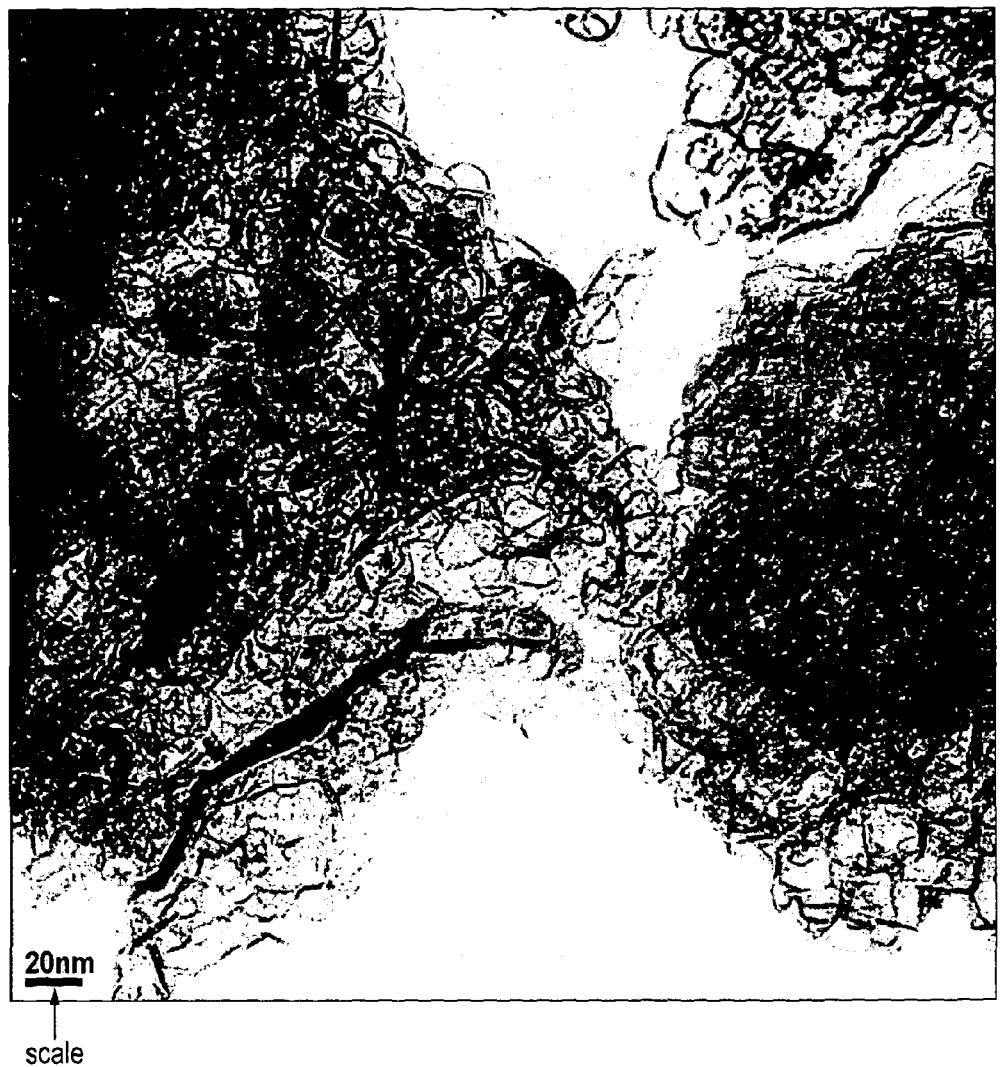
FIG. 23 shows a selected nanoplatelet material obtained in Example 7.

Exfoliated graphite obtained as in Example 6 was subjected to classification by dispersion in water and ultrasonication, whereupon only the finest particles remained at the top of the jar. These were separated physically and recovered. FIG. 23 shows that they are remarkably small and uniformly very thin platelets; a very high-value material obtained by a simple and economical process.

Functionalisation

Figure 25:
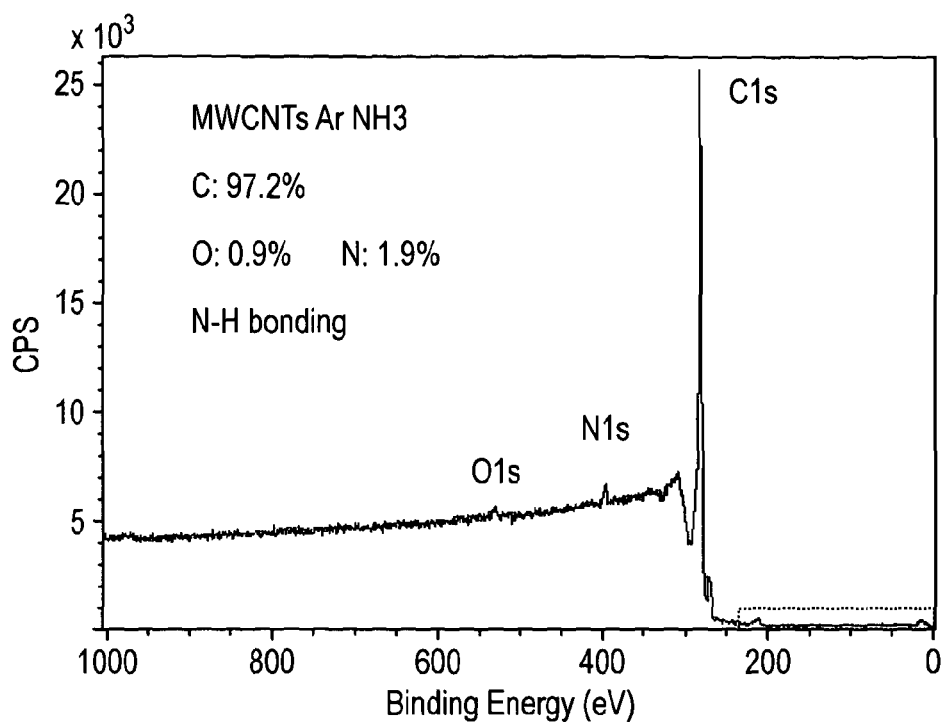
FIGS. 25 and 26 are ESCA (XPS) results showing the surface elemental analysis of CNTs functionalised by the present treatment methods.
Figure 26:
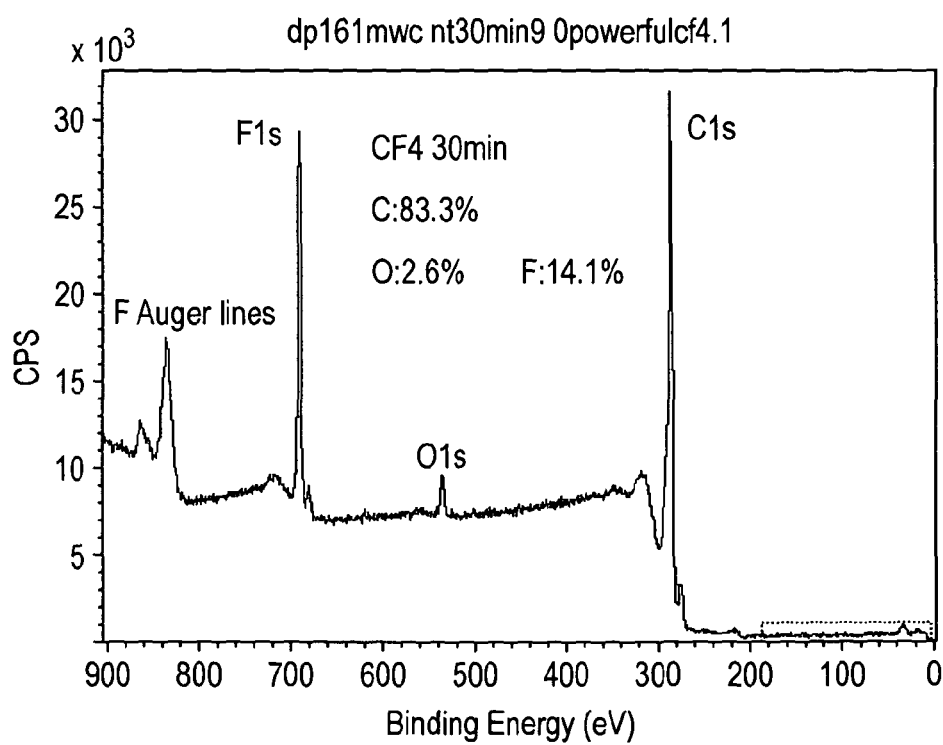

FIGS. 25 and 26 show XPS (ESCA) surface analysis for treated carbon nanotubes (Baytubes™). The untreated tubes showed 96% carbon, 4% oxygen.

After thirty minutes of treatment of a 25 g sample in an ammonia-containing plasma (ammonia diluted in Ar), using the steel balls as above, the analysis showed carbon at 97.2%, oxygen 0.9%, nitrogen 1.9%: see FIG. 25. Unwanted O had been reduced and N—H functions introduced.

FIG. 26 shows corresponding results after the same treatment but in a plasma containing $CF_4$. After treatment, carbon was 83.3%, oxygen 2.6% and fluorine 14.1%. This represents a high level of surface fluorine functionalisation.

The invention claimed is:

1. A particle treatment method for disaggregating, deagglomerating, exfoliating, cleaning or functionalizing particles, the method comprising:
   placing particles to be treated in a plasma treatment chamber;
   placing a plurality of freely-moveable electrically-conductive solid contact bodies in the plasma treatment chamber so as to be in direct contact with the particles to be treated; and
   agitating the freely-moveable electrically-conductive solid contact bodies together with the particles to be treated in the plasma treatment chamber such that the particles to be treated directly contact the freely-moveable electrically-conductive solid contact bodies and plasma in the treatment chamber,
   wherein the particles are of graphitic carbon, which is exfoliated by the treatment, and after the treatment the treated particles comprise discrete graphitic or graphene platelets having a platelet thickness less than 100 nm and a major dimension perpendicular to the thickness which is at least 10 times the thickness.

2. Particle treatment method of claim 1 in which the particles to be treated are graphite particles or carbon nanotubes.

3. Particle treatment method of claim 1 in which the treatment chamber is a rotatable drum in which the contact bodies are tumbled with the particles to be treated.

4. Particle treatment method according to claim 1 in which the treatment chamber has a wall which defines an interior space, an electrode extends into the interior space, and the wall of the treatment chamber is conductive and forms a counter-electrode to said electrode.

5. Particle treatment method according to claim 1 in which glow plasma forms on the surfaces of the contact bodies.

6. Particle treatment method according to claim 1 in which the contact bodies are metal balls or metal-coated balls.

7. Particle treatment method according to claim 1 in which the contact bodies have a diameter, and the diameter is at least 1 mm and not more than 60 mm.

8. Particle treatment method according to claim 1 in which a pressure in the treatment chamber is less than 500 Pa.

9. Particle treatment method according to claim 1 in which, during the treatment, gas is fed to the treatment chamber and gas is removed from the treatment chamber through a filter.

10. Particle treatment method of claim 1 in which the treated particles or disaggregated, deagglomerated or exfoliated components thereof resulting from the treatment, are chemically functionalised by components of the plasma-forming gas, forming carboxy, carbonyl, OH, amine, amide or halogen functionalities on their surfaces.

11. Particle treatment method according to claim 1 in which plasma-forming gas in the treatment chamber is or comprises any selected from oxygen, water, hydrogen peroxide, alcohol, nitrogen, ammonia, amino-bearing organic compound, halogen, halogydrocarbon and noble gas.

12. Particle treatment method according to claim 1 in which said treatment is continued for at least 30 minutes.

13. Particle treatment method according to claim 12 in which said treatment is continued until the treated particles comprise by weight at least 80% of platelets less than 30 nm thick, and in which the major dimension is at least 10 times the thickness.

14. Particle treatment method according to claim 12 in which said treatment is continued until the treated particles comprises by weight at least 90% of platelets less than 20 nm thick, and in which the major dimension is at least 10 times the thickness.

15. Particle treatment method according to claim 1 in which said treatment is continued until the treated particles comprises by weight at least 90% of platelets less than 100 nm thick and in which the major dimension is at least 10 times the thickness.

16. A method of preparing a particle dispersion or a composite material, comprising:
   (a) treating particles by a particle treatment method for disaggregating, deagglomerating, exfoliating, cleaning or functionalizing particles, the particle treatment method comprising:
      placing particles to be treated in a plasma treatment chamber;
      placing a plurality of freely-moveable electrically-conductive solid contact bodies in the plasma treatment chamber so as to be in direct contact with the particles to be treated; and
      agitating the freely-moveable electrically-conductive solid contact bodies together with the particles to be treated in the plasma treatment chamber such that the particles to be treated directly contact the freely-moveable electrically-conductive solid contact bodies and plasma in the treatment chamber,
   (b) dispersing the treated particles in a matrix material which is polymeric or is a precursor of a polymer;
   wherein the treated particles comprise carbon nanotubes, or graphitic or graphene platelets having a platelet thickness less than 100 nm and a major dimension perpendicular to the thickness which is at least 10 times the thickness, and are dispersed in a said polymeric matrix material to make an electrically-conductive composite material.

* * * * *